US006908201B2

(12) United States Patent
Gudeman et al.

(10) Patent No.: US 6,908,201 B2
(45) Date of Patent: Jun. 21, 2005

(54) MICRO-SUPPORT STRUCTURES

(75) Inventors: Christopher Gudeman, Los Gatos, CA (US); James Hunter, Campbell, CA (US); Richard Yeh, Fremont, CA (US); David T. Amm, Sunnyvale, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 178 days.

(21) Appl. No.: 10/186,911

(22) Filed: Jun. 28, 2002

(65) Prior Publication Data

US 2004/0001264 A1 Jan. 1, 2004

(51) Int. Cl.$^7$ ................................................. G02B 5/08

(52) U.S. Cl. ........................ 359/883; 359/884; 359/837

(58) Field of Search ................................. 359/883–884, 359/837, 9, 95, 223–226, 247, 290–292; 324/230; 257/48, 621, 700–777

(56) References Cited

U.S. PATENT DOCUMENTS

| 1,525,550 A | 2/1925 | Jenkins |
| 1,548,262 A | 8/1925 | Freedman |
| RE16,767 E | 10/1927 | Jenkins |
| 1,814,701 A | 7/1931 | Ives |
| 2,415,226 A | 2/1947 | Sziklai ........................ 178/5.4 |
| 2,783,406 A | 2/1957 | Vanderhooft ................. 313/70 |
| 2,920,529 A | 1/1960 | Blythe ........................... 88/73 |
| 2,991,690 A | 7/1961 | Grey et al. .................. 88/16.6 |
| RE25,169 E | 5/1962 | Glenn |
| 3,256,465 A | 6/1966 | Weissenstern et al. ...... 317/101 |
| 3,388,301 A | 6/1968 | James ......................... 317/234 |
| 3,443,871 A | 5/1969 | Chitayat ..................... 356/106 |

(Continued)

FOREIGN PATENT DOCUMENTS

| DE | 32 33 195 A1 | 3/1983 | .......... H01L/23/52 |
| DE | 43 23 799 A1 | 1/1994 | .......... H01L/23/50 |
| DE | 197 23 618 A1 | 12/1997 | ............ G03F/1/14 |

(Continued)

OTHER PUBLICATIONS

R. Apte, "Grating Light Valves for High Resolution Displays", Solid State Sensors and Actuators Workshop, Ph D. Dissertation, Stanford University (Jun. 1994).

O. Solgaard, "Integrated Semiconductor Light Modulators for Fiber–Optic and Display Applications", Ph.D. Dissertation, Stanford University Feb., 1992.

J. Neff, "Two–Dimensional Spatial Light Modulators: A Tutorial", Proceedings of the IEEE, vol. 78, No. 5 (May 1990), pp. 826–855.

(Continued)

*Primary Examiner*—Mohammad Sikder
(74) *Attorney, Agent, or Firm*—Okamoto & Benedicto LLP

(57) ABSTRACT

A MEM device in accordance with the invention comprises one or more movable micro-structures which are preferably ribbon structures or cantilever structures. The ribbon structures or cantilever structures are preferably coupled to a substrate structure through one or more support regions comprising a plurality of anchor support features and a plurality of post support features. The MEM device is preferably an optical MEM device with a plurality of movable ribbon structures each being supported by opposing ends through support regions each comprising a plurality of anchor support features and a plurality of post support features. In accordance with the method of the embodiments, the positions of the anchor and post support features, the number of anchor and support features and the spacings between the support features can selected during fabrication of the device to determine an operating condition of the MEM device.

7 Claims, 13 Drawing Sheets

U.S. PATENT DOCUMENTS

| | | | |
|---|---|---|---|
| 3,553,364 A | 1/1971 | Lee | 178/7.3 |
| 3,576,394 A | 4/1971 | Lee | 178/7.3 |
| 3,600,798 A | 8/1971 | Lee | 29/592 |
| 3,656,837 A | 4/1972 | Sandbank | 350/161 |
| 3,657,610 A | 4/1972 | Yamamoto et al. | 317/243 |
| 3,693,239 A | 9/1972 | Dix | 29/470 |
| 3,743,507 A | 7/1973 | Ih et al. | 96/81 |
| 3,752,563 A | 8/1973 | Torok et al. | 350/151 |
| 3,781,465 A | 12/1973 | Ernstoff et al. | 178/5.4 BD |
| 3,783,184 A | 1/1974 | Ernstoff et al. | 178/5.4 BD |
| 3,792,916 A | 2/1974 | Sarna | 350/163 |
| 3,802,769 A | 4/1974 | Rotz et al. | 352/43 |
| 3,811,186 A | 5/1974 | Larnerd et al. | 29/626 |
| 3,861,784 A | 1/1975 | Torok | 350/162 R |
| 3,862,360 A | 1/1975 | Dill et al. | 178/7.3 D |
| 3,871,014 A | 3/1975 | King et al. | 357/67 |
| 3,886,310 A | 5/1975 | Guldberg et al. | 178/7.5 D |
| 3,896,338 A | 7/1975 | Nathanson et al. | 315/373 |
| 3,915,548 A | 10/1975 | Opittek | 350/3.5 |
| 3,935,499 A | 1/1976 | Oess | 313/413 |
| 3,935,500 A | 1/1976 | Oess et al. | 313/495 |
| 3,938,881 A | 2/1976 | Biegelsen et al. | 350/161 |
| 3,941,456 A | 3/1976 | Schilz et al. | 350/161 |
| 3,942,245 A | 3/1976 | Jackson et al. | 29/591 |
| 3,943,281 A | 3/1976 | Keller et al. | 178/7.5 D |
| 3,947,105 A | 3/1976 | Smith | 353/121 |
| 3,969,611 A | 7/1976 | Fonteneau | 219/502 |
| 3,980,476 A | 9/1976 | Wysocki | 96/1.1 |
| 3,991,416 A | 11/1976 | Byles et al. | 340/324 R |
| 4,001,663 A | 1/1977 | Bray | 321/2 |
| 4,004,849 A | 1/1977 | Shattuck | 350/160 R |
| 4,006,968 A | 2/1977 | Ernstoff et al. | 350/160 LC |
| 4,009,939 A | 3/1977 | Okano | 350/162 SF |
| 4,011,009 A | 3/1977 | Lama et al. | 350/162 R |
| 4,012,116 A | 3/1977 | Yevick | 350/132 |
| 4,012,835 A | 3/1977 | Wallick | 29/591 |
| 4,017,158 A | 4/1977 | Booth | 350/162 SF |
| 4,020,381 A | 4/1977 | Oess et al. | 313/302 |
| 4,021,766 A | 5/1977 | Aine | 338/2 |
| 4,034,211 A | 7/1977 | Horst et al. | 235/61.12 N |
| 4,034,399 A | 7/1977 | Drukier et al. | 357/68 |
| 4,035,068 A | 7/1977 | Rawson | 353/122 |
| 4,067,129 A | 1/1978 | Abramson et al. | 40/563 |
| 4,084,437 A | 4/1978 | Finnegan | 73/361 |
| 4,090,219 A | 5/1978 | Ernstoff et al. | 358/59 |
| 4,093,346 A | 6/1978 | Nishino et al. | 350/162 SF |
| 4,093,921 A | 6/1978 | Buss | 325/459 |
| 4,093,922 A | 6/1978 | Buss | 325/459 |
| 4,100,579 A | 7/1978 | Ernstoff | 358/230 |
| 4,103,273 A | 7/1978 | Keller | 338/2 |
| 4,126,380 A | 11/1978 | Borm | 350/266 |
| 4,127,322 A | 11/1978 | Jacobson et al. | 353/31 |
| 4,135,502 A | 1/1979 | Peck | 128/76.5 |
| 4,139,257 A | 2/1979 | Matsumoto | 350/6.1 |
| 4,143,943 A | 3/1979 | Rawson | 350/120 |
| 4,163,570 A | 8/1979 | Greenaway | 283/8 A |
| 4,184,700 A | 1/1980 | Greenaway | 283/6 |
| 4,185,891 A | 1/1980 | Kaestner | 350/167 |
| 4,190,855 A | 2/1980 | Inoue | 357/80 |
| 4,195,915 A | 4/1980 | Lichty et al. | 350/345 |
| 4,205,428 A | 6/1980 | Ernstoff et al. | 29/592 R |
| 4,211,918 A | 7/1980 | Nyfeler et al. | 235/454 |
| 4,223,050 A | 9/1980 | Nyfeler et al. | 427/163 |
| 4,225,913 A | 9/1980 | Bray | 363/97 |
| 4,249,796 A | 2/1981 | Sincerbox et al. | 350/370 |
| 4,250,217 A | 2/1981 | Greenaway | 428/161 |
| 4,250,393 A | 2/1981 | Greenaway | 250/566 |
| 4,256,787 A | 3/1981 | Shaver et al. | 428/1 |
| 4,257,016 A | 3/1981 | Kramer, Jr. et al. | 322/7.51 |
| 4,290,672 A | 9/1981 | Whitefield | 350/358 |
| 4,295,145 A | 10/1981 | Latta | 346/108 |
| 4,311,999 A | 1/1982 | Upton et al. | 340/755 |
| 4,327,411 A | 4/1982 | Turner | 364/900 |
| 4,327,966 A | 5/1982 | Bloom | 350/162 R |
| 4,331,972 A | 5/1982 | Rajchman | 358/60 |
| 4,336,982 A | 6/1982 | Rector, Jr. | 350/358 |
| 4,338,660 A | 7/1982 | Kelley et al. | 364/200 |
| 4,343,535 A | 8/1982 | Bleha, Jr. | 350/342 |
| 4,346,965 A | 8/1982 | Sprague et al. | 350/358 |
| 4,348,079 A | 9/1982 | Johnson | 350/358 |
| 4,355,463 A | 10/1982 | Burns | 29/827 |
| 4,361,384 A | 11/1982 | Bosserman | 350/174 |
| 4,369,524 A | 1/1983 | Rawson et al. | 455/606 |
| 4,374,397 A | 2/1983 | Mir | 358/75 |
| 4,389,096 A | 6/1983 | Hori et al. | 350/339 R |
| 4,391,490 A | 7/1983 | Hartke | 350/356 |
| 4,396,246 A | 8/1983 | Holman | 350/96.14 |
| 4,398,798 A | 8/1983 | Krawczak et al. | 350/162.24 |
| 4,400,740 A | 8/1983 | Traino et al. | 358/293 |
| 4,408,884 A | 10/1983 | Kleinknecht et al. | 356/355 |
| 4,414,583 A | 11/1983 | Hooker, III | 358/300 |
| 4,417,386 A | 11/1983 | Exner | 29/590 |
| 4,418,397 A | 11/1983 | Brantingham et al. | 364/900 |
| 4,420,717 A | 12/1983 | Wallace et al. | 318/696 |
| 4,422,099 A | 12/1983 | Wolfe | 358/293 |
| 4,426,768 A | 1/1984 | Black et al. | 29/583 |
| 4,430,584 A | 2/1984 | Someshwar et al. | 307/465 |
| 4,435,041 A | 3/1984 | Torok et al. | 350/162.24 |
| 4,440,839 A | 4/1984 | Mottier | 430/2 |
| 4,443,819 A | 4/1984 | Funada et al. | 358/236 |
| 4,443,845 A | 4/1984 | Hamilton et al. | 364/200 |
| 4,447,881 A | 5/1984 | Brantingham et al. | 364/488 |
| 4,454,591 A | 6/1984 | Lou | 364/900 |
| 4,456,338 A | 6/1984 | Gelbart | 350/358 |
| 4,460,907 A | 7/1984 | Nelson | 346/153.1 |
| 4,462,046 A | 7/1984 | Spight | 358/101 |
| 4,467,342 A | 8/1984 | Tower | 357/30 |
| 4,468,725 A | 8/1984 | Venturini | 363/160 |
| 4,483,596 A | 11/1984 | Marshall | 350/385 |
| 4,484,188 A | 11/1984 | Ott | 340/728 |
| 4,487,677 A | 12/1984 | Murphy | 204/247 |
| 4,492,435 A | 1/1985 | Banton et al. | 350/360 |
| 4,503,494 A | 3/1985 | Hamilton et al. | 364/200 |
| 4,511,220 A | 4/1985 | Scully | 350/403 |
| 4,538,883 A | 9/1985 | Sprague et al. | 350/356 |
| 4,545,610 A | 10/1985 | Lakritz et al. | 29/589 |
| 4,556,378 A | 12/1985 | Nyfeler et al. | 425/143 |
| 4,558,171 A | 12/1985 | Gantley et al. | 174/52 FP |
| 4,561,011 A | 12/1985 | Kohara et al. | |
| 4,561,044 A | 12/1985 | Ogura et al. | 362/84 |
| 4,566,935 A | 1/1986 | Hornbeck | 156/626 |
| 4,567,585 A | 1/1986 | Gelbart | 369/97 |
| 4,571,041 A | 2/1986 | Gaudyn | 353/10 |
| 4,571,603 A | 2/1986 | Hornbeck et al. | 346/160 |
| 4,577,932 A | 3/1986 | Gelbart | 350/358 |
| 4,577,933 A | 3/1986 | Yip et al. | 350/358 |
| 4,588,957 A | 5/1986 | Balant et al. | 330/4.3 |
| 4,590,548 A | 5/1986 | Maytum | 363/161 |
| 4,594,501 A | 6/1986 | Culley et al. | 219/492 |
| 4,596,992 A | 6/1986 | Hornbeck | 346/76 PH |
| 4,615,595 A | 10/1986 | Hornbeck | 353/122 |
| 4,623,219 A | 11/1986 | Trias | 350/351 |
| 4,636,039 A | 1/1987 | Turner | 350/356 |
| 4,636,866 A | 1/1987 | Hattori | 358/236 |
| 4,641,193 A | 2/1987 | Glenn | 358/233 |
| 4,645,881 A | 2/1987 | LeToumelin et al. | 379/252 |
| 4,646,158 A | 2/1987 | Ohno et al. | 358/236 |
| 4,649,085 A | 3/1987 | Landram | 428/620 |
| 4,649,432 A | 3/1987 | Watanabe | 358/241 |
| 4,652,932 A | 3/1987 | Miyajima et al. | 358/236 |
| 4,655,539 A | 4/1987 | Caulfield et al. | 350/3.6 |

| Patent No. | Date | Inventor | Class |
|---|---|---|---|
| 4,660,938 A | 4/1987 | Kazan | 350/355 |
| 4,661,828 A | 4/1987 | Miller, Jr. et al. | 346/108 |
| 4,662,746 A | 5/1987 | Hornbeck | 350/269 |
| 4,663,670 A | 5/1987 | Ito et al. | 358/245 |
| 4,687,326 A | 8/1987 | Corby, Jr. | 356/5 |
| 4,698,602 A | 10/1987 | Armitage | 332/7.51 |
| 4,700,276 A | 10/1987 | Freyman et al. | 361/403 |
| 4,707,064 A | 11/1987 | Dobrowolski et al. | 350/96.19 |
| 4,709,995 A | 12/1987 | Kuribayashi et al. | 350/350 |
| 4,710,732 A | 12/1987 | Hornbeck | 332/7.51 |
| 4,711,526 A | 12/1987 | Hennings et al. | 350/170 |
| 4,714,326 A | 12/1987 | Usui et al. | 350/485 |
| 4,717,066 A | 1/1988 | Goldenberg et al. | 228/179 |
| 4,719,507 A | 1/1988 | Bos | 358/92 |
| 4,721,629 A | 1/1988 | Sakai et al. | 427/35 |
| 4,722,593 A | 2/1988 | Shimazaki | 350/336 |
| 4,724,467 A | 2/1988 | Yip et al. | 355/71 |
| 4,728,185 A | 3/1988 | Thomas | 353/122 |
| 4,743,091 A | 5/1988 | Gelbart | 350/252 |
| 4,744,633 A | 5/1988 | Sheiman | 350/132 |
| 4,747,671 A | 5/1988 | Takahashi et al. | 350/336 |
| 4,751,509 A | 6/1988 | Kubota et al. | 340/784 |
| 4,761,253 A | 8/1988 | Antes | 264/1.3 |
| 4,763,975 A | 8/1988 | Scifres et al. | 350/96.15 |
| 4,765,865 A | 8/1988 | Gealer et al. | 156/647 |
| 4,772,094 A | 9/1988 | Sheiman | 350/133 |
| 4,797,694 A | 1/1989 | Agostinelli et al. | 346/160 |
| 4,797,918 A | 1/1989 | Lee et al. | 380/20 |
| 4,801,194 A | 1/1989 | Agostinelli et al. | 350/356 |
| 4,803,560 A | 2/1989 | Matsunaga et al. | 359/236 |
| 4,804,641 A | 2/1989 | Arlt et al. | 437/227 |
| 4,807,021 A | 2/1989 | Okumura | 357/75 |
| 4,807,965 A | 2/1989 | Garakani | 350/131 |
| 4,809,078 A | 2/1989 | Yabe et al. | 358/236 |
| 4,811,082 A | 3/1989 | Jacobs et al. | 357/80 |
| 4,811,210 A | 3/1989 | McAulay | 364/200 |
| 4,814,759 A | 3/1989 | Gombrich et al. | 340/771 |
| 4,817,850 A | 4/1989 | Wiener-Avnear et al. | 228/119 |
| 4,824,200 A | 4/1989 | Isono et al. | 350/96.16 |
| 4,827,391 A | 5/1989 | Sills | 363/41 |
| 4,829,365 A | 5/1989 | Eichenlaub | 358/3 |
| 4,836,649 A | 6/1989 | Ledebuhr et al. | 350/331 R |
| 4,856,863 A | 8/1989 | Sampsell et al. | 350/96.16 |
| 4,856,869 A | 8/1989 | Sakata et al. | 350/162.18 |
| 4,859,012 A | 8/1989 | Cohn | 350/96.24 |
| 4,859,060 A | 8/1989 | Katagiri et al. | 356/352 |
| 4,866,488 A | 9/1989 | Frensley | 357/4 |
| 4,882,683 A | 11/1989 | Rupp et al. | 364/521 |
| 4,893,509 A | 1/1990 | MacIver et al. | 73/517 AV |
| 4,896,325 A | 1/1990 | Coldren | 372/20 |
| 4,896,948 A | 1/1990 | Dono et al. | 350/355 |
| 4,897,708 A | 1/1990 | Clements | 357/65 |
| 4,902,083 A | 2/1990 | Wells | 350/6.6 |
| 4,915,463 A | 4/1990 | Barbee, Jr. | 350/1.1 |
| 4,915,479 A | 4/1990 | Clarke | 350/345 |
| 4,924,413 A | 5/1990 | Suwannukul | 364/521 |
| 4,926,241 A | 5/1990 | Carey | 357/75 |
| 4,930,043 A | 5/1990 | Wiegand | 361/283 |
| 4,934,773 A | 6/1990 | Becker | 350/6.6 |
| 4,940,309 A | 7/1990 | Baum | 350/171 |
| 4,943,815 A | 7/1990 | Aldrich et al. | 346/108 |
| 4,945,773 A | 8/1990 | Sickafus | 73/862.59 |
| 4,949,148 A | 8/1990 | Bartelink | 357/74 |
| 4,950,890 A | 8/1990 | Gelbart | 250/237 G |
| 4,952,925 A | 8/1990 | Haastert | 340/784 |
| 4,954,789 A | 9/1990 | Sampsell | 330/4.3 |
| 4,956,619 A | 9/1990 | Hornbeck | 330/4.3 |
| 4,961,633 A | 10/1990 | Ibrahim et al. | 350/392 |
| 4,963,012 A | 10/1990 | Tracy et al. | 350/641 |
| 4,970,575 A | 11/1990 | Soga et al. | 357/72 |
| 4,978,202 A | 12/1990 | Yang | 350/331 R |
| 4,982,184 A | 1/1991 | Kirkwood | 340/783 |
| 4,982,265 A | 1/1991 | Watanabe et al. | 357/75 |
| 4,984,824 A | 1/1991 | Antes et al. | 283/91 |
| 4,999,308 A | 3/1991 | Nishiura et al. | 437/4 |
| 5,003,300 A | 3/1991 | Wells | 340/705 |
| 5,009,473 A | 4/1991 | Hunter et al. | 350/6.6 |
| 5,013,141 A | 5/1991 | Sakata | 350/348 |
| 5,018,256 A | 5/1991 | Hornbeck | 29/25.01 |
| 5,022,750 A | 6/1991 | Flasck | 353/31 |
| 5,023,905 A | 6/1991 | Wells et al. | 379/96 |
| 5,024,494 A | 6/1991 | Williams et al. | 350/3.6 |
| 5,028,939 A | 7/1991 | Hornbeck et al. | 346/160 |
| 5,031,144 A | 7/1991 | Persky | |
| 5,035,473 A | 7/1991 | Kuwayama et al. | 350/3.7 |
| 5,037,173 A | 8/1991 | Sampsell et al. | 385/17 |
| 5,039,628 A | 8/1991 | Carey | 437/183 |
| 5,040,052 A | 8/1991 | McDavid | 357/80 |
| 5,041,395 A | 8/1991 | Steffen | 437/206 |
| 5,041,851 A | 8/1991 | Nelson | 346/160 |
| 5,043,917 A | 8/1991 | Okamoto | 364/518 |
| 5,048,077 A | 9/1991 | Wells et al. | 379/96 |
| 5,049,901 A | 9/1991 | Gelbart | 346/108 |
| 5,058,992 A | 10/1991 | Takahashi | 359/567 |
| 5,060,058 A | 10/1991 | Goldenberg et al. | 358/60 |
| 5,061,049 A | 10/1991 | Hornbeck | 359/224 |
| 5,066,614 A | 11/1991 | Dunaway et al. | 437/209 |
| 5,068,205 A | 11/1991 | Baxter et al. | 437/205 |
| 5,072,239 A | 12/1991 | Mitcham et al. | 346/108 |
| 5,072,418 A | 12/1991 | Boutaud et al. | 364/715.06 |
| 5,074,947 A | 12/1991 | Estes et al. | 156/307.3 |
| 5,075,940 A | 12/1991 | Kuriyama et al. | 29/25.01 |
| 5,079,544 A | 1/1992 | DeMond et al. | 340/701 |
| 5,081,617 A | 1/1992 | Gelbart | 369/112 |
| 5,083,857 A | 1/1992 | Hornbeck | 359/291 |
| 5,085,497 A | 2/1992 | Um et al. | 359/848 |
| 5,089,903 A | 2/1992 | Kuwayama et al. | 359/15 |
| 5,093,281 A | 3/1992 | Eshima | 437/217 |
| 5,096,279 A | 3/1992 | Hornbeck et al. | 359/230 |
| 5,099,353 A | 3/1992 | Hornbeck | 359/291 |
| 5,101,184 A | 3/1992 | Antes | 235/454 |
| 5,101,236 A | 3/1992 | Nelson et al. | 355/229 |
| 5,103,334 A | 4/1992 | Swanberg | 359/197 |
| 5,105,207 A | 4/1992 | Nelson | 346/160 |
| 5,105,299 A | 4/1992 | Anderson et al. | 359/223 |
| 5,105,369 A | 4/1992 | Nelson | 364/525 |
| 5,107,372 A | 4/1992 | Gelbart et al. | 359/824 |
| 5,112,436 A | 5/1992 | Bol | 156/643 |
| 5,113,272 A | 5/1992 | Reamey | 359/53 |
| 5,113,285 A | 5/1992 | Franklin et al. | 359/465 |
| 5,115,344 A | 5/1992 | Jaskie | 359/573 |
| 5,119,204 A | 6/1992 | Hashimoto et al. | 358/254 |
| 5,121,343 A | 6/1992 | Faris | 395/111 |
| 5,126,812 A | 6/1992 | Greiff | 357/25 |
| 5,126,826 A | 6/1992 | Kauchi et al. | 357/72 |
| 5,126,836 A | 6/1992 | Um | 358/60 |
| 5,128,660 A | 7/1992 | DeMond et al. | 340/707 |
| 5,129,716 A | 7/1992 | Holakovszky et al. | 351/50 |
| 5,132,723 A | 7/1992 | Gelbart | 355/40 |
| 5,132,812 A | 7/1992 | Takahashi et al. | 359/9 |
| 5,136,695 A | 8/1992 | Goldshlag et al. | 395/275 |
| 5,137,836 A | 8/1992 | Lam | 437/8 |
| 5,142,303 A | 8/1992 | Nelson | 346/108 |
| 5,142,405 A | 8/1992 | Hornbeck | 359/226 |
| 5,142,677 A | 8/1992 | Ehlig et al. | 395/650 |
| 5,144,472 A | 9/1992 | Sang, Jr. et al. | 359/254 |
| 5,147,815 A | 9/1992 | Casto | 437/51 |
| 5,148,157 A | 9/1992 | Florence | 340/783 |
| 5,148,506 A | 9/1992 | McDonald | 385/16 |
| 5,149,405 A | 9/1992 | Bruns et al. | 204/129.1 |
| 5,150,205 A | 9/1992 | Um et al. | 358/60 |
| 5,151,718 A | 9/1992 | Nelson | 346/160 |

| | | | |
|---|---|---|---|
| 5,151,724 A | 9/1992 | Kikinis .................... 357/17 |
| 5,151,763 A | 9/1992 | Marek et al. ............... 357/26 |
| 5,153,770 A | 10/1992 | Harris ..................... 359/245 |
| 5,155,604 A | 10/1992 | Miekka et al. ............... 359/2 |
| 5,155,615 A | 10/1992 | Tagawa .................... 359/213 |
| 5,155,778 A | 10/1992 | Magel et al. ................. 385/18 |
| 5,155,812 A | 10/1992 | Ehlig et al. ................ 395/275 |
| 5,157,304 A | 10/1992 | Kane et al. ................ 313/495 |
| 5,159,485 A | 10/1992 | Nelson ..................... 359/291 |
| 5,161,042 A | 11/1992 | Hamada .................... 359/41 |
| 5,162,787 A | 11/1992 | Thompson et al. .......... 340/794 |
| 5,164,019 A | 11/1992 | Sinton ....................... 136/249 |
| 5,165,013 A | 11/1992 | Faris ....................... 395/104 |
| 5,168,401 A | 12/1992 | Endriz ...................... 359/625 |
| 5,168,406 A | 12/1992 | Nelson ..................... 359/855 |
| 5,170,156 A | 12/1992 | DeMond et al. ............ 340/794 |
| 5,170,269 A | 12/1992 | Lin et al. ...................... 359/9 |
| 5,170,283 A | 12/1992 | O'Brien et al. .............. 359/291 |
| 5,172,161 A | 12/1992 | Nelson ..................... 355/200 |
| 5,172,262 A | 12/1992 | Hornbeck .................. 359/223 |
| 5,177,724 A | 1/1993 | Gelbart .................... 369/44.16 |
| 5,178,728 A | 1/1993 | Boysel et al. ............... 156/656 |
| 5,179,274 A | 1/1993 | Sampsell .................. 250/208.2 |
| 5,179,367 A | 1/1993 | Shimizu .................... 340/700 |
| 5,181,231 A | 1/1993 | Parikh et al. .................. 377/26 |
| 5,182,665 A | 1/1993 | O'Callaghan et al. ......... 359/95 |
| 5,185,660 A | 2/1993 | Um ............................ 358/60 |
| 5,185,823 A | 2/1993 | Kaku et al. |
| 5,188,280 A | 2/1993 | Nakao et al. ............... 228/123 |
| 5,189,404 A | 2/1993 | Masimo et al. ............. 340/720 |
| 5,189,505 A | 2/1993 | Bartelink ................... 257/419 |
| 5,191,405 A | 3/1993 | Tomita et al. ............... 257/777 |
| 5,192,864 A | 3/1993 | McEwen et al. ............ 250/234 |
| 5,192,946 A | 3/1993 | Thompson et al. .......... 340/794 |
| 5,198,895 A | 3/1993 | Vick ........................ 358/103 |
| D334,557 S | 4/1993 | Hunter et al. .............. D14/114 |
| D334,742 S | 4/1993 | Hunter et al. .............. D14/113 |
| 5,202,785 A | 4/1993 | Nelson ..................... 359/214 |
| 5,206,629 A | 4/1993 | DeMond et al. ............ 340/719 |
| 5,206,829 A | 4/1993 | Thakoor et al. |
| 5,208,818 A | 5/1993 | Gelbart et al. ................ 372/30 |
| 5,208,891 A | 5/1993 | Prysner ..................... 385/116 |
| 5,210,637 A | 5/1993 | Puzey ....................... 359/263 |
| 5,212,115 A | 5/1993 | Cho et al. .................. 437/208 |
| 5,212,555 A | 5/1993 | Stoltz ....................... 358/206 |
| 5,212,582 A | 5/1993 | Nelson ..................... 359/224 |
| 5,214,308 A | 5/1993 | Nishiguchi et al. ......... 257/692 |
| 5,214,419 A | 5/1993 | DeMond et al. ............ 340/794 |
| 5,214,420 A | 5/1993 | Thompson et al. .......... 340/795 |
| 5,216,278 A | 6/1993 | Lin et al. |
| 5,216,537 A | 6/1993 | Hornbeck .................. 359/291 |
| 5,216,544 A | 6/1993 | Horikawa et al. ........... 359/622 |
| 5,219,794 A | 6/1993 | Satoh et al. ................ 437/209 |
| 5,220,200 A | 6/1993 | Blanton .................... 257/778 |
| 5,221,400 A | 6/1993 | Staller et al. ............... 156/292 |
| 5,221,982 A | 6/1993 | Faris ........................ 359/93 |
| 5,224,088 A | 6/1993 | Atiya ........................ 369/97 |
| D337,320 S | 7/1993 | Hunter et al. .............. D14/113 |
| 5,226,099 A | 7/1993 | Mignardi et al. ............ 385/19 |
| 5,229,597 A | 7/1993 | Fukatsu |
| 5,230,005 A | 7/1993 | Rubino et al. ................ 372/20 |
| 5,231,363 A | 7/1993 | Sano et al. ................. 332/109 |
| 5,231,388 A | 7/1993 | Stoltz ....................... 340/783 |
| 5,231,432 A | 7/1993 | Glenn ........................ 353/31 |
| 5,233,456 A | 8/1993 | Nelson ..................... 359/214 |
| 5,233,460 A | 8/1993 | Partlo et al. ................ 359/247 |
| 5,233,874 A | 8/1993 | Putty et al. .............. 73/517 AV |
| 5,237,340 A | 8/1993 | Nelson ..................... 346/108 |
| 5,237,435 A | 8/1993 | Kurematsu et al. ........... 359/41 |
| 5,239,448 A | 8/1993 | Perkins et al. .............. 361/764 |
| 5,239,806 A | 8/1993 | Maslakow .................... 53/432 |
| 5,240,818 A | 8/1993 | Mignardi et al. ............ 430/321 |
| 5,245,686 A | 9/1993 | Faris et al. ................. 385/120 |
| 5,247,180 A | 9/1993 | Mitcham et al. .......... 250/492.1 |
| 5,247,593 A | 9/1993 | Lin et al. ..................... 385/17 |
| 5,249,245 A | 9/1993 | Lebby et al. ................. 385/89 |
| 5,251,057 A | 10/1993 | Guerin et al. ............... 359/249 |
| 5,251,058 A | 10/1993 | MacArthur ................. 359/249 |
| 5,254,980 A | 10/1993 | Hendrix et al. ............... 345/84 |
| 5,255,100 A | 10/1993 | Urbanus .................... 358/231 |
| 5,256,869 A | 10/1993 | Lin et al. .................. 250/201.9 |
| 5,258,325 A | 11/1993 | Spitzer et al. ................ 437/86 |
| 5,260,718 A | 11/1993 | Rommelmann et al. ... 346/107 R |
| 5,260,798 A | 11/1993 | Um et al. ................... 358/233 |
| 5,262,000 A | 11/1993 | Welbourn et al. ........... 156/643 |
| 5,272,473 A | 12/1993 | Thompson et al. ............. 345/7 |
| 5,278,652 A | 1/1994 | Urbanus et al. ............. 358/160 |
| 5,278,925 A | 1/1994 | Boysel et al. ................ 385/14 |
| 5,280,277 A | 1/1994 | Hornbeck .................. 345/108 |
| 5,281,887 A | 1/1994 | Engle ....................... 310/335 |
| 5,281,957 A | 1/1994 | Schoolman ................... 345/8 |
| 5,285,105 A | 2/1994 | Cain ........................ 257/672 |
| 5,285,196 A | 2/1994 | Gale, Jr. .................... 345/108 |
| 5,285,407 A | 2/1994 | Gale et al. ............... 365/189.11 |
| 5,287,096 A | 2/1994 | Thompson et al. .......... 345/147 |
| 5,287,215 A | 2/1994 | Warde et al. ............... 359/293 |
| 5,289,172 A | 2/1994 | Gale, Jr. et al. ............. 345/108 |
| 5,291,317 A | 3/1994 | Newswanger ................ 359/15 |
| 5,291,473 A | 3/1994 | Pauli ........................ 369/112 |
| 5,293,511 A | 3/1994 | Poradish et al. ............. 257/434 |
| 5,296,408 A | 3/1994 | Wilbarg et al. ............. 437/203 |
| 5,296,891 A | 3/1994 | Vogt et al. ................... 355/67 |
| 5,296,950 A | 3/1994 | Lin et al. ...................... 359/9 |
| 5,298,460 A | 3/1994 | Nishiguchi et al. ......... 437/183 |
| 5,299,037 A | 3/1994 | Sakata ....................... 359/41 |
| 5,299,289 A | 3/1994 | Omae et al. .................. 359/95 |
| 5,300,813 A | 4/1994 | Joshi et al. ................. 257/752 |
| 5,301,062 A | 4/1994 | Takahashi et al. ........... 359/567 |
| 5,303,043 A | 4/1994 | Glenn ........................ 348/40 |
| 5,303,055 A | 4/1994 | Hendrix et al. ............. 348/761 |
| 5,307,056 A | 4/1994 | Urbanus .................... 340/189 |
| 5,307,185 A | 4/1994 | Jones et al. .................. 359/41 |
| 5,310,624 A | 5/1994 | Ehrlich ..................... 430/322 |
| 5,311,349 A | 5/1994 | Anderson et al. ........... 359/223 |
| 5,311,360 A | 5/1994 | Bloom et al. ............... 359/572 |
| 5,312,513 A | 5/1994 | Florence et al. ............. 156/643 |
| 5,313,479 A | 5/1994 | Florence ..................... 372/26 |
| 5,313,648 A | 5/1994 | Ehlig et al. ................. 395/800 |
| 5,313,835 A | 5/1994 | Dunn ......................... 73/505 |
| 5,315,418 A | 5/1994 | Sprague et al. ............... 359/41 |
| 5,315,423 A | 5/1994 | Hong ........................ 359/124 |
| 5,315,429 A | 5/1994 | Abramov |
| 5,319,214 A | 6/1994 | Gregory et al. .......... 250/504 R |
| 5,319,668 A | 6/1994 | Luecke ..................... 372/107 |
| 5,319,789 A | 6/1994 | Ehlig et al. ................. 395/800 |
| 5,319,792 A | 6/1994 | Ehlig et al. ................. 395/800 |
| 5,320,709 A | 6/1994 | Bowden et al. |
| 5,321,416 A | 6/1994 | Bassett et al. ................. 345/8 |
| 5,323,002 A | 6/1994 | Sampsell et al. .......... 250/252.1 |
| 5,323,051 A | 6/1994 | Adams et al. .............. 257/417 |
| 5,325,116 A | 6/1994 | Sampsell .................... 346/108 |
| 5,327,286 A | 7/1994 | Sampsell et al. ............ 359/561 |
| 5,329,289 A | 7/1994 | Sakamoto et al. ........... 345/126 |
| 5,330,301 A | 7/1994 | Brancher .................... 414/417 |
| 5,330,878 A | 7/1994 | Nelson ..................... 430/311 |
| 5,331,454 A | 7/1994 | Hornbeck .................. 359/224 |
| 5,334,991 A | 8/1994 | Wells et al. ................... 345/8 |
| 5,339,116 A | 8/1994 | Urbanus et al. ............. 348/716 |
| 5,339,177 A | 8/1994 | Jenkins et al. ................ 359/35 |
| 5,340,772 A | 8/1994 | Rosotker ................... 437/226 |
| 5,345,521 A | 9/1994 | McDonald et al. ........... 385/19 |
| 5,347,321 A | 9/1994 | Gove ........................ 348/663 |

| | | | |
|---|---|---|---|
| 5,347,378 A | 9/1994 | Handschy et al. ............ 359/53 |
| 5,347,433 A | 9/1994 | Sedlmayr .................... 362/32 |
| 5,348,619 A | 9/1994 | Bohannon et al. .......... 156/664 |
| 5,349,687 A | 9/1994 | Ehlig et al. ................. 395/800 |
| 5,351,052 A | 9/1994 | D'Hont et al. ................ 342/42 |
| 5,352,926 A | 10/1994 | Andrews .................... 257/717 |
| 5,354,416 A | 10/1994 | Okudaira ................... 156/643 |
| 5,357,369 A | 10/1994 | Pilling et al. ............... 359/462 |
| 5,357,803 A | 10/1994 | Lane ....................... 73/517 B |
| 5,359,349 A | 10/1994 | Jambor et al. ............. 345/168 |
| 5,359,451 A | 10/1994 | Gelbart et al. ............. 359/285 |
| 5,361,131 A | 11/1994 | Tekemori et al. ........... 356/355 |
| 5,363,220 A | 11/1994 | Kuwayama et al. ........... 359/3 |
| 5,365,283 A | 11/1994 | Doherty et al. ............. 348/743 |
| 5,367,585 A | 11/1994 | Ghezzo et al. ................ 385/23 |
| 5,370,742 A | 12/1994 | Mitchell et al. .............. 134/10 |
| 5,371,543 A | 12/1994 | Anderson ................... 348/270 |
| 5,371,618 A | 12/1994 | Tai et al. ..................... 359/53 |
| 5,377,705 A | 1/1995 | Smith, Jr. et al. .......... 134/95.3 |
| 5,382,961 A | 1/1995 | Gale, Jr. ..................... 345/108 |
| 5,387,924 A | 2/1995 | Gale, Jr. et al. ............. 345/108 |
| 5,389,182 A | 2/1995 | Mignardi .................... 156/344 |
| 5,391,881 A | 2/1995 | Jeuch et al. ........... 250/370.09 |
| 5,392,140 A | 2/1995 | Ezra et al. .................... 359/41 |
| 5,392,151 A | 2/1995 | Nelson ........................ 359/223 |
| 5,394,303 A | 2/1995 | Yamaji ....................... 361/749 |
| 5,398,071 A | 3/1995 | Gove et al. ................. 348/558 |
| 5,399,898 A | 3/1995 | Rostoker .................... 257/499 |
| 5,404,365 A | 4/1995 | Hiiro .......................... 372/27 |
| 5,404,485 A | 4/1995 | Ban ........................... 395/425 |
| 5,408,123 A | 4/1995 | Murai ........................ 257/531 |
| 5,410,315 A | 4/1995 | Huber ........................ 342/42 |
| 5,411,769 A | 5/1995 | Hornbeck ................... 427/534 |
| 5,412,186 A | 5/1995 | Gale ........................... 219/679 |
| 5,412,501 A | 5/1995 | Fisli .......................... 359/286 |
| 5,418,584 A | 5/1995 | Larson ....................... 353/122 |
| 5,420,655 A | 5/1995 | Shimizu ...................... 353/33 |
| 5,420,722 A | 5/1995 | Bielak ........................ 359/708 |
| 5,426,072 A | 6/1995 | Finnila ....................... 437/208 |
| 5,427,975 A | 6/1995 | Sparks et al. ................ 437/79 |
| 5,430,524 A | 7/1995 | Nelson ....................... 355/200 |
| 5,435,876 A | 7/1995 | Alfaro et al. ............... 156/247 |
| 5,438,477 A | 8/1995 | Pasch ......................... 361/689 |
| 5,439,731 A | 8/1995 | Li et al. ...................... 428/209 |
| 5,442,411 A | 8/1995 | Urbanus et al. ............ 348/771 |
| 5,442,414 A | 8/1995 | Janssen et al. ............... 353/98 |
| 5,444,566 A | 8/1995 | Gale et al. .................. 359/291 |
| 5,445,559 A | 8/1995 | Gale et al. .................. 451/388 |
| 5,446,479 A | 8/1995 | Thompson et al. ......... 345/139 |
| 5,447,600 A | 9/1995 | Webb ............................ 216/2 |
| 5,448,314 A | 9/1995 | Heimbuch et al. .......... 348/743 |
| 5,448,546 A | 9/1995 | Pauli .......................... 369/112 |
| 5,450,088 A | 9/1995 | Meier et al. .................. 342/51 |
| 5,450,219 A | 9/1995 | Gold et al. ................... 359/40 |
| 5,451,103 A | 9/1995 | Hatanaka et al. ............ 353/31 |
| 5,452,024 A | 9/1995 | Sampsell .................... 348/755 |
| 5,452,138 A | 9/1995 | Mignardi et al. ........... 359/855 |
| 5,453,747 A | 9/1995 | D'Hont et al. ................ 342/42 |
| 5,453,778 A | 9/1995 | Venkateswar et al. ....... 347/239 |
| 5,453,803 A | 9/1995 | Shapiro et al. .............. 353/119 |
| 5,454,160 A | 10/1995 | Nickel .......................... 29/840 |
| 5,454,906 A | 10/1995 | Baker et al. ................... 216/66 |
| 5,455,445 A | 10/1995 | Kurtz et al. ................. 257/419 |
| 5,455,455 A | 10/1995 | Badehi ........................ 257/690 |
| 5,455,602 A | 10/1995 | Tew ........................... 347/239 |
| 5,457,493 A | 10/1995 | Leddy et al. ................ 348/164 |
| 5,457,566 A | 10/1995 | Sampsell et al. ............ 359/292 |
| 5,457,567 A | 10/1995 | Shinohara ................... 359/305 |
| 5,458,716 A | 10/1995 | Alfaro et al. ................ 156/245 |
| 5,459,492 A | 10/1995 | Venkateswar ................ 347/253 |
| 5,459,528 A | 10/1995 | Pettitt ......................... 348/568 |
| 5,459,592 A | 10/1995 | Shibatani et al. ............. 359/40 |
| 5,459,610 A | 10/1995 | Bloom et al. ............... 359/572 |
| 5,461,197 A | 10/1995 | Hiruta et al. ............... 174/52.4 |
| 5,461,410 A | 10/1995 | Venkateswar et al. ....... 347/240 |
| 5,461,411 A | 10/1995 | Florence et al. ............. 347/240 |
| 5,461,547 A | 10/1995 | Ciupke et al. ................ 362/31 |
| 5,463,347 A | 10/1995 | Jones et al. ................. 330/253 |
| 5,463,497 A | 10/1995 | Muraki et al. ............... 359/618 |
| 5,465,175 A | 11/1995 | Woodgate et al. ........... 359/463 |
| 5,467,106 A | 11/1995 | Salomon ...................... 345/87 |
| 5,467,138 A | 11/1995 | Gove ......................... 348/452 |
| 5,467,146 A | 11/1995 | Huang et al. ............... 348/743 |
| 5,469,302 A | 11/1995 | Lim .......................... 359/846 |
| 5,471,341 A | 11/1995 | Warde et al. ................ 359/293 |
| 5,473,512 A | 12/1995 | Degani et al. ............... 361/760 |
| 5,475,236 A | 12/1995 | Yoshizaki .................... 257/48 |
| 5,480,839 A | 1/1996 | Ezawa et al. ............... 437/209 |
| 5,481,118 A | 1/1996 | Tew ........................... 250/551 |
| 5,481,133 A | 1/1996 | Hsu .......................... 257/621 |
| 5,482,564 A | 1/1996 | Douglas et al. ............... 134/18 |
| 5,482,818 A | 1/1996 | Nelson ........................ 430/394 |
| 5,483,307 A | 1/1996 | Anderson ..................... 353/98 |
| 5,485,172 A | 1/1996 | Sawachika et al. ............. 345/8 |
| 5,485,304 A | 1/1996 | Kaeriyama .................. 359/291 |
| 5,485,354 A | 1/1996 | Ciupke et al. ................ 362/31 |
| 5,486,698 A | 1/1996 | Hanson et al. .............. 250/332 |
| 5,486,841 A | 1/1996 | Hara et al. ..................... 345/8 |
| 5,486,946 A | 1/1996 | Jachimowicz et al. ....... 359/263 |
| 5,488,431 A | 1/1996 | Gove et al. .................. 348/716 |
| 5,489,952 A | 2/1996 | Gove et al. .................. 348/771 |
| 5,490,009 A | 2/1996 | Venkateswar et al. ....... 359/291 |
| 5,491,510 A | 2/1996 | Gove ........................... 348/77 |
| 5,491,612 A | 2/1996 | Nicewarner, Jr. ............ 361/760 |
| 5,491,715 A | 2/1996 | Flaxl .......................... 375/344 |
| 5,493,177 A | 2/1996 | Muller et al. ................ 313/578 |
| 5,493,439 A | 2/1996 | Engle ......................... 359/292 |
| 5,497,172 A | 3/1996 | Doherty et al. ............... 345/85 |
| 5,497,197 A | 3/1996 | Gove et al. .................. 348/388 |
| 5,497,262 A | 3/1996 | Kaeriyama .................. 359/223 |
| 5,499,060 A | 3/1996 | Gove et al. .................. 348/651 |
| 5,499,062 A | 3/1996 | Urbanus ..................... 348/771 |
| 5,500,761 A | 3/1996 | Goossen et al. ............. 359/290 |
| 5,502,481 A | 3/1996 | Dentinger et al. ............. 348/51 |
| 5,504,504 A | 4/1996 | Markandey et al. ......... 345/214 |
| 5,504,514 A | 4/1996 | Nelson ....................... 347/130 |
| 5,504,575 A | 4/1996 | Stafford ..................... 356/330 |
| 5,504,614 A | 4/1996 | Webb et al. ................. 359/223 |
| 5,506,171 A | 4/1996 | Leonard et al. ............. 437/187 |
| 5,506,597 A | 4/1996 | Thompson et al. ........... 345/85 |
| 5,506,720 A | 4/1996 | Yoon ......................... 359/224 |
| 5,508,558 A | 4/1996 | Robinette, Jr. et al. ...... 257/700 |
| 5,508,561 A | 4/1996 | Tago et al. .................. 257/737 |
| 5,508,565 A | 4/1996 | Hatakeyama et al. ....... 257/777 |
| 5,508,750 A | 4/1996 | Hewlett et al. ............. 348/558 |
| 5,508,840 A | 4/1996 | Vogel et al. ................. 359/291 |
| 5,508,841 A | 4/1996 | Lin et al. ..................... 359/318 |
| 5,510,758 A | 4/1996 | Fujita et al. ................. 333/247 |
| 5,510,824 A | 4/1996 | Nelson ....................... 347/130 |
| 5,512,374 A | 4/1996 | Wallace et al. .............. 428/422 |
| 5,512,748 A | 4/1996 | Hanson ...................... 250/332 |
| 5,515,076 A | 5/1996 | Thompson et al. .......... 345/139 |
| 5,516,125 A | 5/1996 | McKenna ...................... 279/3 |
| 5,517,340 A | 5/1996 | Doany et al. .................. 359/41 |
| 5,517,347 A | 5/1996 | Sampsell .................... 359/224 |
| 5,517,357 A | 5/1996 | Shibayama ................. 359/547 |
| 5,517,359 A | 5/1996 | Gelbart ...................... 359/623 |
| 5,519,251 A | 5/1996 | Sato et al. ................... 257/666 |
| 5,519,450 A | 5/1996 | Urbanus et al. ............. 348/600 |
| 5,521,748 A | 5/1996 | Sarraf ........................ 359/321 |
| 5,523,619 A | 6/1996 | McAllister et al. .......... 257/686 |
| 5,523,628 A | 6/1996 | Williams et al. ............. 257/777 |

| Patent No. | Date | Inventor | Class |
|---|---|---|---|
| 5,523,803 A | 6/1996 | Urbanus et al. | 348/771 |
| 5,523,878 A | 6/1996 | Wallace et al. | 359/290 |
| 5,523,881 A | 6/1996 | Florence et al. | 359/561 |
| 5,523,920 A | 6/1996 | Machuga et al. | 361/767 |
| 5,524,155 A | 6/1996 | Weaver | 385/24 |
| 5,526,834 A | 6/1996 | Mielnik et al. | 134/105 |
| 5,534,107 A | 7/1996 | Gray et al. | 156/643.1 |
| 5,534,883 A | 7/1996 | Koh | 345/3 |
| 5,539,422 A | 7/1996 | Heacock et al. | 345/8 |
| 5,544,306 A | 8/1996 | Deering et al. | 395/164 |
| 5,552,635 A | 9/1996 | Kim et al. | |
| 5,554,304 A | 9/1996 | Suzuki | 216/2 |
| 5,576,878 A | 11/1996 | Henck | 359/224 |
| 5,602,671 A | 2/1997 | Hornbeck | 359/224 |
| 5,606,181 A | 2/1997 | Sakuma et al. | 257/88 |
| 5,606,447 A | 2/1997 | Asada et al. | 359/199 |
| 5,610,438 A | 3/1997 | Wallace et al. | 257/682 |
| 5,623,361 A | 4/1997 | Engle | 359/291 |
| 5,629,566 A | 5/1997 | Doi et al. | 257/789 |
| 5,629,801 A | 5/1997 | Staker et al. | 359/572 |
| 5,640,216 A | 6/1997 | Hasegawa et al. | 349/58 |
| 5,658,698 A | 8/1997 | Yagi et al. | 430/11 |
| 5,661,592 A | 8/1997 | Bornstein et al. | 359/291 |
| 5,661,593 A | 8/1997 | Engle | 359/292 |
| 5,663,817 A | 9/1997 | Frapin et al. | 349/5 |
| 5,668,611 A | 9/1997 | Ernstoff et al. | 348/771 |
| 5,673,139 A | 9/1997 | Johnson | 359/291 |
| 5,677,783 A | 10/1997 | Bloom et al. | 359/224 |
| 5,689,361 A | 11/1997 | Damen et al. | 359/284 |
| 5,691,836 A | 11/1997 | Clark | 359/247 |
| 5,694,740 A | 12/1997 | Martin et al. | 53/431 |
| 5,696,560 A | 12/1997 | Songer | 348/436 |
| 5,699,740 A | 12/1997 | Gelbart | 101/477 |
| 5,704,700 A | 1/1998 | Kappel et al. | 353/31 |
| 5,707,160 A | 1/1998 | Bowen | 400/472 |
| 5,712,649 A | 1/1998 | Tosaki | 345/8 |
| 5,713,652 A | 2/1998 | Zavracky et al. | 353/122 |
| 5,726,480 A | 3/1998 | Pister | 257/415 |
| 5,731,802 A | 3/1998 | Aras et al. | 345/148 |
| 5,734,224 A | 3/1998 | Tagawa et al. | 313/493 |
| 5,742,373 A | 4/1998 | Alvelda | 349/204 |
| 5,744,752 A | 4/1998 | McHerron et al. | 174/52.4 |
| 5,745,271 A | 4/1998 | Ford et al. | 359/130 |
| 5,757,354 A | 5/1998 | Kawamura | 345/199 |
| 5,757,536 A | 5/1998 | Ricco et al. | 359/224 |
| 5,764,280 A | 6/1998 | Bloom et al. | 348/53 |
| 5,768,009 A | 6/1998 | Little | 359/293 |
| 5,770,473 A | 6/1998 | Hall et al. | 438/26 |
| 5,793,519 A | 8/1998 | Furlani et al. | 359/291 |
| 5,798,743 A | 8/1998 | Bloom | 345/90 |
| 5,798,805 A | 8/1998 | Ooi et al. | 349/10 |
| 5,801,074 A | 9/1998 | Kim et al. | 438/125 |
| 5,802,222 A | 9/1998 | Rasch et al. | 385/1 |
| 5,808,323 A | 9/1998 | Spaeth et al. | 257/88 |
| 5,808,797 A | 9/1998 | Bloom et al. | 359/572 |
| 5,815,126 A | 9/1998 | Fan et al. | 345/8 |
| 5,825,443 A | 10/1998 | Kawasaki et al. | 349/95 |
| 5,832,148 A | 11/1998 | Yariv | |
| 5,835,255 A | 11/1998 | Miles | 359/291 |
| 5,835,256 A | 11/1998 | Huibers | 359/291 |
| 5,837,562 A | 11/1998 | Cho | 438/51 |
| 5,841,579 A | 11/1998 | Bloom et al. | 359/572 |
| 5,841,929 A | 11/1998 | Komatsu et al. | |
| 5,844,711 A | 12/1998 | Long, Jr. | |
| 5,847,859 A | 12/1998 | Murata | 359/201 |
| 5,862,164 A | 1/1999 | Hill | 372/27 |
| 5,867,302 A * | 2/1999 | Fleming | 359/291 |
| 5,868,854 A | 2/1999 | Kojima et al. | 134/1.3 |
| 5,886,675 A | 3/1999 | Aye et al. | 345/7 |
| 5,892,505 A | 4/1999 | Tropper | 345/208 |
| 5,895,233 A | 4/1999 | Higashi et al. | 438/107 |
| 5,898,515 A | 4/1999 | Furlani et al. | 359/290 |
| 5,903,243 A | 5/1999 | Jones | 345/7 |
| 5,903,395 A | 5/1999 | Rallison et al. | 359/630 |
| 5,904,737 A | 5/1999 | Preston et al. | 8/158 |
| 5,910,856 A | 6/1999 | Ghosh et al. | 359/291 |
| 5,912,094 A | 6/1999 | Aksyuk et al. | 430/5 |
| 5,912,608 A | 6/1999 | Asada | 335/222 |
| 5,914,801 A | 6/1999 | Dhuler et al. | 359/230 |
| 5,915,168 A | 6/1999 | Salatino et al. | 438/110 |
| 5,919,548 A | 7/1999 | Barron et al. | 428/138 |
| 5,920,411 A | 7/1999 | Duck et al. | 359/127 |
| 5,920,418 A | 7/1999 | Shiono et al. | 359/246 |
| 5,923,475 A | 7/1999 | Kurtz et al. | 359/619 |
| 5,926,309 A | 7/1999 | Little | 359/293 |
| 5,926,318 A | 7/1999 | Hebert | 359/618 |
| 5,942,791 A | 8/1999 | Shorrocks et al. | 257/522 |
| 5,949,390 A | 9/1999 | Nomura et al. | 345/32 |
| 5,949,570 A | 9/1999 | Shiono et al. | 359/291 |
| 5,953,161 A | 9/1999 | Troxell et al. | 359/618 |
| 5,955,771 A | 9/1999 | Kurtz et al. | 257/419 |
| 5,963,788 A | 10/1999 | Barron et al. | 438/48 |
| 5,978,127 A | 11/1999 | Berg | 359/279 |
| 5,982,553 A | 11/1999 | Bloom et al. | 359/627 |
| 5,986,634 A | 11/1999 | Alioshin | 345/126 |
| 5,986,796 A | 11/1999 | Miles | 359/260 |
| 5,995,303 A | 11/1999 | Honguh et al. | 359/708 |
| 5,999,319 A | 12/1999 | Castracane | 359/573 |
| 6,004,912 A | 12/1999 | Gudeman | 508/577 |
| 6,012,336 A | 1/2000 | Eaton et al. | |
| 6,016,222 A | 1/2000 | Setani et al. | 359/571 |
| 6,025,859 A | 2/2000 | Ide et al. | 347/135 |
| 6,038,057 A | 3/2000 | Brazas, Jr. et al. | 359/291 |
| 6,040,748 A | 3/2000 | Gueissaz | 335/78 |
| 6,046,840 A | 4/2000 | Huibers | 359/291 |
| 6,055,090 A | 4/2000 | Miles | 359/291 |
| 6,057,520 A | 5/2000 | Goodwin-Johansson | 200/181 |
| 6,061,166 A | 5/2000 | Furlani et al. | 359/254 |
| 6,061,489 A | 5/2000 | Ezra | 385/147 |
| 6,062,461 A | 5/2000 | Sparks et al. | 228/123.1 |
| 6,064,404 A | 5/2000 | Aras et al. | 345/507 |
| 6,069,392 A | 5/2000 | Tai et al. | 257/419 |
| 6,071,652 A | 6/2000 | Feldman et al. | 430/5 |
| 6,075,632 A | 6/2000 | Braun | 359/124 |
| 6,084,626 A | 7/2000 | Ramanujan et al. | 347/239 |
| 6,088,102 A | 7/2000 | Manhart | 356/354 |
| 6,090,717 A | 7/2000 | Powell et al. | 438/710 |
| 6,091,521 A | 7/2000 | Popovich | 359/15 |
| 6,096,576 A | 8/2000 | Corbin et al. | 438/108 |
| 6,096,656 A | 8/2000 | Matzke et al. | |
| 6,097,352 A | 8/2000 | Zavracky et al. | 345/7 |
| 6,101,036 A | 8/2000 | Bloom | 359/567 |
| 6,115,168 A | 9/2000 | Zhao et al. | 359/247 |
| 6,122,299 A | 9/2000 | DeMars et al. | 372/20 |
| 6,123,985 A | 9/2000 | Robinson et al. | 427/162 |
| 6,124,145 A | 9/2000 | Stemme et al. | 438/26 |
| 6,130,770 A | 10/2000 | Bloom | 359/224 |
| 6,144,481 A | 11/2000 | Kowarz et al. | 359/291 |
| 6,147,789 A | 11/2000 | Gelbart | 359/231 |
| 6,154,259 A | 11/2000 | Hargis et al. | 348/756 |
| 6,154,305 A | 11/2000 | Dickensheets et al. | |
| 6,163,026 A | 12/2000 | Bawolek et al. | 250/351 |
| 6,163,402 A | 12/2000 | Chou et al. | 359/443 |
| 6,169,624 B1 | 1/2001 | Godil et al. | 359/237 |
| 6,172,796 B1 | 1/2001 | Kowarz et al. | 359/290 |
| 6,172,797 B1 | 1/2001 | Huibers | 359/291 |
| 6,177,980 B1 | 1/2001 | Johnson | 355/67 |
| 6,181,458 B1 | 1/2001 | Brazas, Jr. et al. | 359/290 |
| 6,188,519 B1 | 2/2001 | Johnson | 359/572 |
| 6,195,196 B1 | 2/2001 | Kimura et al. | 359/295 |
| 6,197,610 B1 | 3/2001 | Toda | 438/50 |
| 6,210,988 B1 | 4/2001 | Howe et al. | 438/50 |

| | | | | | | | | | |
|---|---|---|---|---|---|---|---|---|---|
| 6,215,579 | B1 | 4/2001 | Bloom et al. | 359/298 | EP | 0 627 644 A3 | 9/1990 | | G02B/27/00 |
| 6,219,015 | B1 | 4/2001 | Bloom et al. | 345/87 | EP | 0 417 039 A1 | 3/1991 | | G03B/21/20 |
| 6,222,954 | B1 | 4/2001 | Riza | 385/18 | EP | 0 423 513 A2 | 4/1991 | | H01S/3/085 |
| 6,229,650 | B1 | 5/2001 | Reznichenko et al. | 359/566 | EP | 0 436 738 A1 | 7/1991 | | H04N/5/74 |
| 6,229,683 | B1 | 5/2001 | Goodwin-Johansson | 361/233 | EP | 0 458 316 A2 | 11/1991 | | G06K/11/06 |
| 6,241,143 | B1 | 6/2001 | Kuroda | 228/110.1 | EP | 0 477 566 A2 | 4/1992 | | G02B/26/08 |
| 6,249,381 | B1 | 6/2001 | Suganuma | | EP | 0 488 326 A3 | 6/1992 | | G09G/3/28 |
| 6,251,842 | B1 | 6/2001 | Gudeman | 508/577 | EP | 0 499 566 A2 | 8/1992 | | G06F/3/033 |
| 6,252,697 | B1 | 6/2001 | Hawkins et al. | 359/290 | EP | 0 528 646 A1 | 2/1993 | | G09G/3/02 |
| 6,254,792 | B1 | 7/2001 | Van Buskirk et al. | 216/13 | EP | 0 530 760 A2 | 3/1993 | | G09G/3/34 |
| 6,261,494 | B1 | 7/2001 | Zavracky et al. | 264/104 | EP | 0 550 189 A1 | 7/1993 | | G02F/1/315 |
| 6,268,952 | B1 | 7/2001 | Godil et al. | 359/291 | EP | 0 610 665 A1 | 8/1994 | | G09G/3/34 |
| 6,271,145 | B1 | 8/2001 | Toda | 438/706 | EP | 0 627 644 A2 | 12/1994 | | G02B/27/00 |
| 6,271,808 | B1 | 8/2001 | Corbin | 345/7 | EP | 0 627 850 A1 | 12/1994 | | H04N/5/64 |
| 6,274,469 | B1 | 8/2001 | Yu | 438/592 | EP | 0 643 314 A2 | 3/1995 | | G02B/27/00 |
| 6,282,213 | B1 | 8/2001 | Gutin et al. | | EP | 0 654 777 A1 | 5/1995 | | G09G/3/34 |
| 6,286,231 | B1 | 9/2001 | Bergman et al. | 34/410 | EP | 0 658 868 A1 | 6/1995 | | G09G/3/34 |
| 6,290,859 | B1 | 9/2001 | Fleming et al. | 216/2 | EP | 0 658 830 A1 | 12/1995 | | G09G/3/34 |
| 6,290,864 | B1 | 9/2001 | Patel et al. | 216/79 | EP | 0 689 078 A1 | 12/1995 | | G02B/26/08 |
| 6,300,148 | B1 | 10/2001 | Birdsley et al. | 438/15 | EP | 0 801 319 A1 | 10/1997 | | G02B/26/00 |
| 6,303,986 | B1 | 10/2001 | Shook | 257/680 | EP | 0 851 492 A2 | 7/1998 | | H01L/23/538 |
| 6,310,018 | B1 | 10/2001 | Behr et al. | 510/175 | EP | 1 003 071 A2 | 5/2000 | | G03B/27/72 |
| 6,313,901 | B1 | 11/2001 | Cacharelis | | EP | 1 014 143 A1 | 6/2000 | | G02B/26/08 |
| 6,323,984 | B1 | 11/2001 | Trisnadi | 359/245 | EP | 1 040 927 A2 | 10/2000 | | B41J/2/455 |
| 6,327,071 | B1 | 12/2001 | Kimura | 359/291 | GB | 2 117 564 A | 10/1983 | | H01L/25/08 |
| 6,342,960 | B1 | 1/2002 | McCullough | 359/124 | GB | 2 118 365 A | 10/1983 | | H01L/27/13 |
| 6,346,430 | B1 | 2/2002 | Raj et al. | | GB | 2 266 385 A | 10/1993 | | G02B/23/10 |
| 6,356,577 | B1 | 3/2002 | Miller | 372/107 | GB | 2 296 152 A | 6/1996 | | H04N/13/04 |
| 6,356,689 | B1 | 3/2002 | Greywall | 385/52 | GB | 2 319 424 A | 5/1998 | | H04N/13/04 |
| 6,359,333 | B1 | 3/2002 | Wood et al. | 257/704 | JP | 53-39068 | 4/1978 | | H01L/23/12 |
| 6,384,959 | B1 | 5/2002 | Furlani et al. | 359/291 | JP | 55-111151 | 8/1980 | | H01L/27/00 |
| 6,387,723 | B1 | 5/2002 | Payne et al. | 438/48 | JP | 57-31166 | 2/1982 | | H01L/23/48 |
| 6,392,309 | B1 | 5/2002 | Wataya et al. | 257/796 | JP | 57-210638 | 12/1982 | | H01L/21/60 |
| 6,396,789 | B1 | 5/2002 | Guerra et al. | 369/112 | JP | 60-49638 | 3/1985 | | H01L/21/60 |
| 6,418,152 | B1 | 7/2002 | Davis | | JP | 60-94756 | 5/1985 | | H01L/25/04 |
| 6,421,179 | B1 | 7/2002 | Gutin et al. | 359/572 | JP | 60-250639 | 12/1985 | | H01L/21/58 |
| 6,438,954 | B1 | 8/2002 | Goetz et al. | | JP | 61-142750 | 6/1986 | | H01L/21/60 |
| 6,445,502 | B1 | 9/2002 | Islam et al. | 359/571 | JP | 61-145838 | 7/1986 | | H01L/21/60 |
| 6,452,260 | B1 | 9/2002 | Corbin et al. | 257/686 | JP | 63-234767 | 9/1988 | | H04N/1/04 |
| 6,466,354 | B1 | 10/2002 | Gudeman | 359/247 | JP | 63-305323 | 12/1988 | | G02F/1/13 |
| 6,479,811 | B1 | 11/2002 | Kruschwitz et al. | | JP | 1-155637 | 6/1989 | | H01L/21/66 |
| 6,480,634 | B1 | 11/2002 | Corrigan | 385/4 | JP | 40-1155637 | 6/1989 | | H01L/21/92 |
| 6,497,490 | B1 | 12/2002 | Miller | 359/614 | JP | 2219092 | 8/1990 | | G09G/3/28 |
| 6,525,863 | B1 | 2/2003 | Riza | 359/290 | JP | 4-333015 | 11/1992 | | G02B/27/18 |
| 6,563,974 | B2 | 5/2003 | Agha Riza | 385/18 | JP | 7-281161 | 10/1995 | | G02F/1/1333 |
| 6,565,222 | B1 | 5/2003 | Ishii et al. | 359/883 | JP | 3288369 | 3/2002 | | G02B/26/06 |
| 6,569,717 | B1 | 5/2003 | Murade | | WO | WO 90/13913 | 11/1990 | | H01L/23/10 |
| 6,593,738 | B2 * | 7/2003 | Kesil et al. | 324/230 | WO | WO 92/12506 | 7/1992 | | G09F/9/37 |
| 6,730,978 | B2 * | 5/2004 | Kubena et al. | 257/414 | WO | WO 93/02269 | 2/1993 | | E06B/5/10 |
| 2001/0019454 | A1 | 9/2001 | Tadic-Galeb et al. | 359/649 | WO | WO 93/09472 | 5/1993 | | G03F/7/20 |
| 2002/0015230 | A1 | 2/2002 | Pilossof et al. | 359/558 | WO | WO 93/18428 | 9/1993 | | G02B/27/00 |
| 2002/0021485 | A1 | 2/2002 | Pilossof | 359/295 | WO | WO 93/22694 | 11/1993 | | G02B/5/18 |
| 2002/0079432 | A1 | 6/2002 | Lee et al. | 250/216 | WO | WO 94/09473 | 4/1994 | | G09G/3/34 |
| 2002/0105725 | A1 | 8/2002 | Sweatt et al. | 359/566 | WO | WO 94/29761 | 12/1994 | | G02B/27/24 |
| 2002/0112746 | A1 | 8/2002 | DeYoung et al. | 134/36 | WO | WO 95/11473 | 4/1995 | | G02B/27/00 |
| 2002/0131228 | A1 | 9/2002 | Potter | | WO | WO 96/02941 | 2/1996 | | H01L/23/02 |
| 2002/0131230 | A1 | 9/2002 | Potter | 361/277 | WO | WO 96/08031 | 3/1996 | | H01J/29/12 |
| 2002/0135708 | A1 | 9/2002 | Murden et al. | | WO | WO 96/41217 | 12/1996 | | G02B/5/18 |
| 2002/0176151 | A1 | 11/2002 | Moon et al. | | WO | WO 96/41224 | 12/1996 | | G02B/19/00 |
| 2002/0195418 | A1 | 12/2002 | Kowarz et al. | | WO | WO 97/22033 | 6/1997 | | G02B/27/22 |
| 2002/0196492 | A1 | 12/2002 | Trisnadi et al. | | WO | WO 97/26569 | 7/1997 | | G02B/5/18 |
| 2003/0056078 | A1 | 3/2003 | Johansson et al. | | WO | WO 98/05935 | 2/1998 | | G01L/9/06 |
| | | | | | WO | WO 98/24240 | 6/1998 | | H04N/9/31 |
| | | FOREIGN PATENT DOCUMENTS | | | WO | WO 98/41893 | 9/1998 | | G02B/26/08 |
| DE | | 197 51 716 A1 | 5/1998 | G02B/27/14 | WO | WO 99/07146 | 2/1999 | | H04N/7/16 |
| EP | | 0 089 044 A2 | 9/1983 | H01L/23/10 | WO | WO 99/12208 | 3/1999 | | H01L/25/065 |
| EP | | 0 261 901 A2 | 3/1988 | G09G/3/36 | WO | WO 99/23520 | 5/1999 | | G02B/26/08 |
| EP | | 0 314 437 A1 | 10/1988 | H01L/25/08 | WO | WO 99/34484 | 7/1999 | | |
| EP | | 0 304 263 A2 | 2/1989 | H01L/25/065 | WO | WO 99/59335 | 11/1999 | | H04N/5/765 |
| EP | | 0 306 308 A2 | 3/1989 | H04N/3/14 | WO | WO 99/63388 | 12/1999 | | G02B/27/22 |
| EP | | 0 322 714 A2 | 7/1989 | G02B/5/30 | WO | WO 99/67671 | 12/1999 | | G02B/26/08 |

| | | | | |
|---|---|---|---|---|
| WO | WO 00/04718 | 1/2000 | ......... | H04N/7/167 |
| WO | WO 00/07225 | 2/2000 | ......... | H01L/21/00 |
| WO | WO 01/04674 A1 | 1/2001 | ......... | G02B/6/12 |
| WO | WO 01/006297 A3 | 1/2001 | ......... | G02B/27/10 |
| WO | WO 01/57581 A3 | 8/2001 | ......... | G02B/27/48 |
| WO | WO 02/025348 A3 | 3/2002 | ......... | G02B/26/02 |
| WO | WO 02/31575 A2 | 4/2002 | ......... | G02B/27/00 |
| WO | WO 02/058111 A2 | 7/2002 | | |
| WO | WO 02/065184 A3 | 8/2002 | ......... | G02B/27/12 |
| WO | WO 02/073286 A2 | 9/2002 | ......... | G02B/26/08 |
| WO | WO 02/084375 A1 | 10/2002 | ......... | G02B/26/08 |
| WO | WO 02/084397 A3 | 10/2002 | ......... | G02B/27/18 |
| WO | WO 03/001281 A1 | 1/2003 | ......... | G02F/1/01 |
| WO | WO 03/001716 A1 | 1/2003 | ......... | H04J/14/02 |
| WO | WO 03/012523 A1 | 2/2003 | ......... | G02B/26/00 |
| WO | WO 03/016965 A1 | 2/2003 | ......... | G02B/5/18 |
| WO | WO 03/023849 A1 | 3/2003 | ......... | H01L/23/02 |
| WO | WO 03/025628 A2 | 3/2003 | | |

OTHER PUBLICATIONS

R. Gerhard–Multhaupt, "Viscoelastic Spatial Light Modulators and Schlieren–Optical Systems for HDTV Projection Displays" SPIE vol. 1255 Large Screen Projection Displays 11 (1990), pp. 69–78.

R. Gerhard–Multhaupt, "Light–Valve Technologies for High–Definition Television Projection Displays", Displays vol. 12, No. 3/4 (1991), pp. 115–128.

O. Solgaard, F. Sandejas, and D. Bloom, "Deformable Grating Optical Modulator," Optics Letters, vol. 17, No. 9, May 1, 1992, New York, USA, pp. 688–690.

F. Sandejas, R. Apte, W. Banyai, and D. Bloom, "Surface Microfabrication of Deformable Grating Valve for High Resolution Displays," The $7^{th}$ International Conference on Solid–State Sensors and Actuators.

P. Alvelda, "High–Efficiency Color Microdisplays," SID 95 Digest, pp. 307–311, 1995.

Worboys et al., "Miniature Display Technology for Integrated Helmut Systems," GEC Journal of Research, vol. 10, No. 2, pp. 111–118, Chelmsford, Essex, GB 1993.

M. Fam et al., "Color Separation by use of Binary Optics," Optics Letters, vol. 18:15 pp. 1214–1216, 1993.

P. Alvelda, "VLSI Microdisplays and Optoelectric Technology," MIT, pp. 1–93, 1995.

P. Alvelda, "VLSI Microdisplay Technology," Oct. 14, 1994.

D. Rowe, "Laser Beam Scanning," SPIE, vol. 2088, Oct. 5, 1993, 18–26.

L. Hornbeck, "Deformable–Mirror Spatial Light Modulators," Spatial Light Modulators and Applications III, Aug. 8, CA 1989, pp. 86–102.

Russick et al., "Supercritical Carbon Dioxide Extraction of Solvent from Micromachined Structures," Supercritical Fluids, Chapter 18, American Chemical Society, pp 255–269, 1997.

Buhler et al., "Linear Array of Complementary Metal Oxide Semiconductor Double–Pass Metal Micromirrors," Optical Engineering, vol. 36, No. 5, pp. 1391–1398, May 1997.

Gani et al., "Variable Gratings for Optical Switching: Rigorous Electromagnetic Simulation and Design," Optical Engineering, vol. 38, No. 3, pp 552–557, Mar. 1999.

R. Tepe, et al. "Viscoelastic Spatial Light Modulator with Active Matrix Addressing," Applied Optics, vol. 28, No. 22, New York, USA, pp. 4826–4834, Nov. 15, 1989.

W. Brinker, et al., "Deformation Behavior of Thin Viscoelastic Layers Used in an Active–Matrix–Addressed Spatial Light Modulator," SPIE vol. 1018, pp. 79–85, Germany, 1988.

T. Utsunomiya and H. Sato, "Electrically Deformable Echellette Grating and its Application to Tunable Laser Resonator," Electronics and Communications in Japan, vol. 63–c, No. 10, pp. 94–100, Japan, 1980.

Burns, D.M. et al., *Development of microelectromechanical variable blaze gratings*, Sensors and Actuators A, pp. 7–15, 1998.

R.N. Thomas, et al., "The Mirror–Matrix Tube: A Novel Light Valve for Projection Displays", IEEE Transactions on Electron Devices, vol. ED–22, No. 9, pp. 765–775, Sep. 1975.

J. Guldberg, et al., " An Aluminum/SiO2/Silicon–on–Sapphire Light Valve Matrix for Projection Displays," Applied Physics Letters, vol. 26, No. 7, pp. 391–393, Apr. 1975.

"Kitchen Computer", IBM Technical Disclosure Bulletin, vol. 37, No. 12, pp. 223–225, Dec. 1994.

"Image Orientation Sensing and Correction for Notepads", Research Disclosure, No. 34788, p. 217, Mar. 1993.

Beck Mason et al., "Directly Modulated Sampled Grating DBR Lasers for Long–Haul WDM Communication Systems" IEEE Photonics Technology Letters, vol. 9, No. 3, Mar. 1997. pp. 377 of 379.

N. J. Frigo et al., "A Wavelength–Division Multiplexed Passive Optical Network with Cost–Shared Components", IEEE Photonics Technology Letters, vol. 6, No. 11, Nov. 1994, pp. 1365–1367.

M. S. Goodman et al., "The LAMBDANET Multiwavelength Network: Architecture, Applications, and Demonstrations", IEEE Journal on Selected Areas in Communications, vol. 8, No. 6, Aug. 1990, pp. 995–1004.

C. A. Turkatte, "Examining the Benefits of Tunable Lasers for Provisioning Bandwidth on Demand", EuroForum—Optical Components, Feb. 2001, pp. 1 of 10.

R. Plastow, "Tunable Lasers and Future Optical Networks", Forum –Tunable Laser, Aug. 2000, pp. 58 of 62.

Elizabeth Bruce, "Tunable Lasers", Communications, IEEE Spectrum, Feb. 2002, pp. 35 of 39.

M. G. Littman et al., "Spectrally Narrow Pulsed Dye Laser without Beam Expander", Applied Optics, vol. 17, No. 14, Jul. 15, 1978, pp. 2224 of 2227.

Apte et al., "Deformable Grating Light Valves for High Resolution Displays," Solid State Actuator Workshop, Hilton Head, South Carolina, Jun. 13–16, 1994.

Sene et al., "Polysilicon micromechnical gratings for optical modulation," Sensors and Actuators, vol. A57, pp. 145–151, 1996.

Amm et al., "Invited Paper: Grating Light Valve™ Technology: Update and Novel Applications," SID Digest, vol. 29, 1998.

Development of Digital MEMS–Based Display Technology Promises Improved Resolution, Contrast, and Speed, XP–000730009, 1997, pp. 33 of 34.

"Micromachined Opto/Electro/Mechanical Systems," Electronic Systems, NASA Tech Briefs, Mar. 1997, pp. 50 & 52.

S.T. Pai, et al., "Electromigration in Metals", Received Jun. 4, 1976, p. 103–115.

Olga B. Spahn, et al., "High Optical Power Handling of Pop–Up Microelectromechanical Mirrors", Sandia National Laboratories, IEEE 2000, p. 51–52.

David M. Burns, et al. "Optical Power Induced Damage to Microelectromechanical Mirrors", Sensors and Actuators A 70, 1998, p. 6–14.

V.S. Aliev et al., "Development of Si(100) surface roughness at the initial stage of etching in F2 and XeF2 gases: ellipsometric study," Surface Science 442 (1999), pp. 206–214.

Xuan–Qi Wang et al., "Gas–Phase Silicon Etching with Bromine Trifluoride," Depart. of Electrical Engineering, 136–93 California Institute of Technology, 1997 IEEE, pp. 1505–1508.

Harold F. Winters, "Etch products from the reaction of XeF2 with SiO2, Si3N4, SiC, and Si in the presence of Ion Bombardment," IBM Research Laboratory, 1983 American Vacuum Society, pp. 927–931.

F.A. Houle, "Dynamics of SiF4 desorption during etching of silicon by XeF2," J. Chem. Phys. 87 (3), Aug. 1, 1987, pp. 1866–1872.

Mehran Mehregany, "Microelectromechanical Systems," 1993 IEEE, pp. 14–22.

D. Moser et al., "A CMOS Compatible Thermally Excited Silicon Oxide Beam Resonator with Aluminium Mirror," Physical Electronics Laboratory, 1991 IEEE, pp. 547–550.

M. Parameswaran et al., "Commercial CMOS Fabricated Integrated Dynamic Thermal Scene Simulator," 1991 IEEE, pp. 29.4.1–29.4.4.

M. Parameswaran et al., "CMOS Electrothermal Microactuators," Depart. of Electrical Engineering, 1990 IEEE, pp. 128–131.

U. Streller et al., "Selectivity in dry etching of Si(100) with XeF2 and VUV light", Applied Surface Science 106, (1996), pp. 341–346.

M.J.M. Vugts et al., "Si/XeF2 etching: Temperature dependence," 1996 American Vacuum Society, pp. 2766–2774.

P. Krummenacher et al., "Smart Temperature Sensor in CMOS Technology," Sensors and Actuators, A–21–A–23 (1990), pp. 636–638.

Henry Baltes, "CMOS as sensor technology," Sensors and Actuators A. 37–38, (1993), pp. 51–56.

Thomas Bultshauser et al., "Piezoresistive Membrane Hygrometers Based on IC Technology," Sensor and Materials, 5, 3, (1993), pp. 125–134.

Z. Parpia et al., "Modelling of CMOS Compatible High Voltage Device Structures," pp. 41–50.

Jon Gildemeister, "Xenon Difluoride Etching Systems," 1997, UC Berkeley MicroTabrication Manual Chapter 7.15, p. 2–5.

W. Riethmuller et al., "A smart accelerometer with on–chip electronics fabricated by a commercial CMOS process," Sensors and Actuators A. 31, (1992), 121–124.

W. Gopel et al., "Sensors– A Comprehensive Survey," vol. 7, Weinheim New York, 44 pgs.

D. E. Ibbotson et al., "Comparison of XeF2 and F–atom reations with Si and SiO2," 1984 American Institute of Physics, pp. 1129–1131.

D. E. Ibbotson et al., "Plasmaless dry etching of silicon with fluorine–containing compounds," 1984 American Institute of Physics, pp. 2939–2942.

M.H. Hecht et al., "A novel x–ray photoelectron spectroscopy study of the AI/SiO2 interfaces," 1985 American Institute of Physics, pp. 5256–52616.

Daniel L. Flamm et al., "XeF2 and F–Atom Reactions with Si: Their Significance for Plasma Etching,," Solid State Technology, V. 26, #4, Apr. 1983, pp. 117–121.

H.F. Winters et al., "The etching of silicon with XeF2 vapor," Appl. Phys. Lett. vol. 34, No. 1, Jan. 1979, pp. 70–73.

Wayne Bailey et al., "Microelectronic Structures and Microelectromechanical Devices for Optical Processing and Multimedia Applications," SPIE—The International Society for Optical Engineering, vol. 2641, Oct. 1995, 13 pgs.

J. Marshall et al., "Realizing Suspended Structures on Chips Fabricated by CMOS Foundry Processes Through the MOSIS Service," National Inst. of Standards and Technology, Jun. 94, 63 pgs.

David Moser et al., "CMOS Flow Sensors," 1993 Physical Electronics Lab, Swiss Federal Institute of Tech, Zurich, Switzerland, 195 pgs.

E. Hecht, "Optics", Addison–Wesley, $2^{nd}$ edition, 1987, Adelphi University, pp. 163–169.

E. Hecht, "Optics", Addison–Wesley, $2^{nd}$ edition, 1987, Adelphi University, pp. 358–360.

T. Glaser et al., "Beam switching with binary single–order diffractive grating", XP–00802142, Optics Letters, Dec. 15, 1998, vol. 23, No. 24, pp. 1933 of 1935.

P. C. Kundu et al., "Reduction of Speckle–Noise by Varying the Polarisation of Illuminating Beam", XP–002183475, Dept. of Applied Physics, Calcutta University, 1975, pp. 63–67.

J. W. Goodman, "Some Fundamental Properties of Speckle", XP–002181682, Dept. of Electrical Engineering, Stanford University, 1976, pp. 1146–1150.

Lingli Wang et al., "Speckle Reduction in Laser Projection Systems by Diffractive Optical Elements", XP–000754330, Applied Optics, Apr. 1, 1998, vol. 37, No. 10, pp. 1770–1775.

R.W. Corrigan et al., "Calibration of a Scanned Linear Grating Light–Valve, Projection System for E–Cinema Applications", Silicon Light Machines, SID '99, San Jose, CA, 27 pgs, 1999.

R.W. Corrigan et al., "Calibration of a Scanned Linear Grating Light–Valve, Projection System", Silicon Light Machine, San Jose, CA, 4 pgs, May 18, 1999.

"Introduction to Cryptography", http://www.ssh.ft/tech/crpto/into.html, 35 pgs, Jun. 21, 1999.

"Deep Sky Black," Equinox Interscience, www.eisci.com/deepsky.html, 1997.

"Absorptive Neutral Density Filters," Newport Corp., Irvine, CA, www.newport.com, May 7, 1999.

"High Energy Variable Attenuators," Newport Corp., Irvine, CA, www.newport.com, May 7, 1999.

"Neutral–Density Filters," New Focus, Inc., Santa Clara, CA, www.newfocus.com, May 7, 1999.

J. Hawkes et al., "Laser Theory and Practice," Prentice Hall, New York, 1995, pp. 407–408.

C. Tew et al., "Electronic Control of a Digital Micromirror Device for Projection Displays", Proceedings of the 1994 IEEE International Solid–State Circuits Conference, 1994.

Henck, S.A., "Lubrication of Digital Micromirror Devices™", Tribology Letters, No. 3, pp. 239–247, 1997.

K. W. Goossen et al., "Silicon Modulator Based on Mechanically–Active Anti–Reflection Layer with 1 Mbit/sec Capability for Fiber–in–the–Loop Applications", IEEE Protonics Technology Letters, vol. 6, No. 9, Sep. 1994, pp. 1119–1121.

J. A. Walker et al., "Demonstration of a Gain Flattened Optical Amplifier with Micromechanical Equalizer Element", Lucent Technologies, pp. 13–14.

A. P. Payne et al., "Resonance Measurements of Stresses in Al/Si$_3$N$_4$ Micro–Ribbons", Silicon Light Machines, Sep. 22, 1999, 11 pgs.

M. W. Miles, "A New Reflective FPD Technology Using Interferometric Modulation", 4 pgs.

N. A. Riza et al., "Digitally Controlled Fault–Tolerant Multiwavelength Programmable Fiber–Optic Attenuator Using a Two–Dimensional Digital Micromirror Device", Optics Letters, Mar. 1, 1999, vol. 24, No. 5, pp. 282–284.

N. A. Riza et al., "Synchronous Amplitude and Time Control for an Optimum Dynamic Range Variable Photonic Delay Line", Applied Optics, Apr. 10, 1999, vol. 38, No. 11, pp. 2309–2318.

P. Alvelda et al., "44.4: Ferroelectric Microdisplays Using Distortion–Compensated Pixel Layouts", SID 95 DIGEST, XP 2020715, pp. 931–933.

* cited by examiner

MICRO-SUPPORT STRUCTURES

FIELD OF THE INVENTION

The invention relates to support structures for micro-structures. More particularly, the present invention relates to support structures for micro-structures in micro-electro mechanical machines.

BACKGROUND OF THE INVENTION

A number of micro-machines utilize movable cantilevers, ribbon structures or other similar micro-structures. Typically, these-micro structures are extremely thin; on the order of hundreds or thousands of Angstroms, and are formed through release etch processes. These thin micro-structures can experience a high degree of stress and tension, either during fabrication and/or during operation of the device. Larger micro-structures can experience stress or tension on the order of 1.5 GPa or higher. Micro-support structures can fail under such conditions leading to device failure.

Optical MEM devices are used to modulate one or more wavelengths of light. Optical MEM devices can have applications in display, print and electrical device technologies. Examples of an optical MEM device which utilize suspended micro-ribbon structures to modulate light are disclosed in the U.S. Pat. Nos. 5,311,360, 5,841,579 and 5,808,797, all issued to Bloom et al., the contents of which are hereby incorporated by reference.

Briefly, an optical MEM device described in the above referenced patents has one or more sets of movable ribbons that comprise a support layer and a reflective top-layer. The support layer is preferably a silicon nitride layer and the reflective top-layer is preferably an aluminum layer. The ribbon structures are typically secured to a substrate through opposite ends of the ribbon, whereby center portions of the ribbons, referred to herein as the active portions, move up and down to modulate an incident light source.

For particular applications, most notable in optical communications, larger ribbon structures are preferred. As previously mentioned, these larger ribbon structures can be subject to high levels of stress and tension both in the fabrication of the device and during the operation of the device. Accordingly, there is a desire for MEM devices with mechanical support structures which are capable of supporting micro-structures exhibiting high stress and/or tension. Further, what is desirable is a method for controlling or tunning the resonant frequency or frequencies and/or the operating voltage or voltages required to deflect the active portions of ribbon structures in an optical MEM structure.

SUMMARY OF THE INVENTION

The current invention is directed to a micro-device comprising at least one suspended micro-structure which is preferably a ribbon structure or cantilever structure. The microstructure is coupled to a substrate structure by at least one end through a securing region. The securing region preferably comprises sets of securing features arranged along the attached end of the suspended micro-structure. The sets of securing features comprises a plurality of anchor support features and a plurality of post support features. The anchor support features and the post support features are preferably arranged in parallel and laterally along the attached end of the micro-structure.

A micro-device in accordance with the embodiments preferably comprises a plurality of ribbon structures configured to modulate light having a wavelength in a range of approximately 300 to 3000 nanometers. Ribbon structures in accordance with the embodiments can be formed to have lengths in a range of 50 to 1000 microns and widths in a range of 4.0 to 40 microns, wherein the stress and/or tension of the ribbon structures can be as great as 1.5 Gpa or higher.

The ribbon structures are preferably coupled through securing regions positioned at opposite ends of each of the ribbon structures. Each of the supporting regions preferably comprises a plurality of anchor support features and a plurality of post support features arranged in parallel rows along the ends of adjacent ribbon structures. However, embodiments with anchor support features and post support features that are arranged in a staggered fashion and/or with alternating separations between anchor support features and post support features on adjacent ribbons structures are contemplated.

In accordance with the embodiments a micro-structure comprises a device layer that preferably comprises a silicon nitride layer with a thickness in a range of 200 to 2000 Angstroms. The device layer can also comprise a top-layer of aluminum with a thickness in a range 250 to 1000 Angstroms thick. The device layer, in accordance with the embodiments can also comprise one or more silicon dioxide layers, either under the nitride layer or between the nitride and the aluminum top layer, as described in detail below.

In accordance with a preferred method of the embodiments, a sacrificial layer, which can be a poly-silicon layer, is deposited to a thickness in a range of 0.5 to 3.0 micron on a suitable substrate structure. The substrate structure can include one or more barrier oxide layers, as described in detail below. The sacrificial layer is then patterned, preferably through an etch process, with at least one set of anchor and post trenches or dimples. The anchor trenches, or dimples, are preferably etched to have cross-sectional dimensions in a range of 5.0 to 20 microns, while the post trenches, or dimples, are preferably etched to have cross-sectional dimensions in a range of 0.5 to 5.0 microns. A device layer, preferably comprising an etch resistant material, is then deposited over the patterned sacrificial layer and within the etched tenches, or dimples, such that portions of the device layer couple to the substrate structure therebelow through the trenches, or dimples, to form the anchor and post support features. The devices layer preferably comprises a silicon nitride-based layer that is deposited to a thickness in a range of 500 to 2000 Angstroms and more preferably deposited to a thickness in a range of 700 to 1200 Angstroms. The device layer can also include one or more silicon oxide-based layers formed over and/or under the silicon nitride-based layer deposited to thicknesses in a range of 500 to 2000 Angstroms.

After the device layer is formed, then the device layer is preferably cut, or divided, into ribbon structures. The device layer can be cut into ribbon structures using a reactive ion etch or other suitable process. The ribbon structures are preferably arranged in parallel with the dimensions such as those described above. The device layer is preferably cut such that two or more anchor and two or more post support features couple each end of the ribbon structures to the substrate structure. The separations between adjacent ribbon structures is preferably as small as possible, and can be on the order of 0.5 microns or less. After the device layer is divided or cut into ribbon structures, then the sacrificial layer is etched to release the ribbon features with the ribbon features suspended over the substrate structure and coupled to the substrate structure through the anchor and post support features formed therefrom.

The separations between the anchor and post supporting features can be tailored to achieve physical properties of the ribbon structures suitable for the application at hand. Each of the ribbon structures preferably has multiple exterior anchor support features and multiple interior post support features arranged near each end of the ribbon structures. Using multiple anchor support features and post support features allows the ribbon structures to be readily tuned or tailored for an operating frequency or set of frequencies and a switching voltage or set of switching voltages and also provides a larger effective support area for supporting the ribbon structures exhibiting high stress and/or tension.

In yet further embodiments of the invention, prior to cutting the device layer into ribbon structures, the device layer is coated or deposited with a reflective top-layer. The reflective top-layer is preferably formed from a reflective metal such as aluminum and can be deposited to a thickness in a range of 250 to 1000 Angstroms. Also while the anchor and post support features are preferably arranged in parallel rows along the ends of the ribbon structures, device configurations with staggered sets of anchor and post support features are contemplated.

BRIEF DESCRIPTION OF THE DRAWINGS

FIG. 3b is cross-sectional representation of a microstructure having a plurality of ribbon structures, such as shown in FIG. 3a.

FIG. 7b schematically illustrates the effective support area provided by the support region shown in FIG. 7a.

DETAILED DESCRIPTION OF THE EMBODIMENTS

Figure 1A:
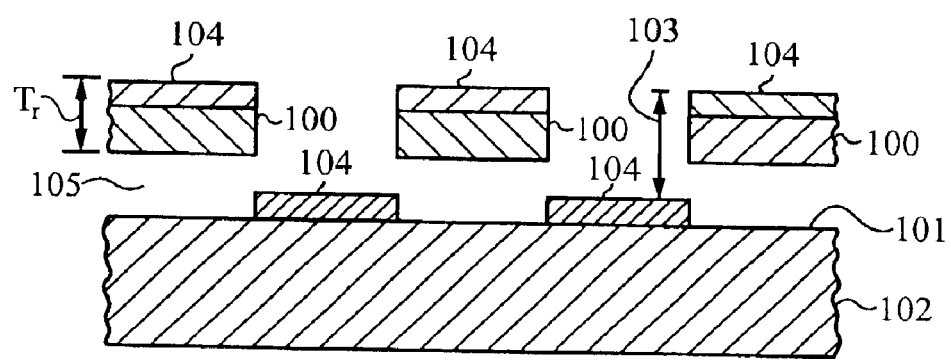
FIGS. 1a–b are cross-sectional representations of a microstructure comprising a plurality of moveable ribbon structures, in accordance with the embodiments.

Referring to FIG. 1a, an optical MEM device can have a plurality of movable ribbons 100 that are spatially arranged over a substrate 102. The surfaces 104, corresponding to the ribbon tops and the regions of the substrate between the ribbons, are reflective. The surfaces 104 are made to be reflective by depositing a thin film of reflective material, such as silver or aluminum on the substrate 102 and the ribbons 100. The ribbons and the substrate structure are micro-fabricated from silicon-based materials. The height difference 103 between the reflective surfaces 104 of the substrate 102 and the reflective surfaces 104 of the ribbons 100 are configured to be $\lambda/2$ when the ribbons 100 are in the up position as shown in FIG. 1a. When light having a wavelength $\lambda$ impinges on the compliment of reflective surfaces 104, light that is reflected from the surfaces 104 of the substrate 102 and ribbons 100 will be in phase. Light which strikes the reflective surfaces 104 of the substrate 102 travels $\lambda/2$ further than the light striking the reflective surfaces 104 of the ribbons 100. Then the portion of light that is reflected back from the reflective surfaces 104 of the substrate 102 returns traveling an addition $\lambda/2$ for a total of one complete wavelength $\lambda$. Therefore, the compliment of the reflective surfaces 104 function as a mirror to the incident light source with a wavelength $\lambda$.

Figure 1B:
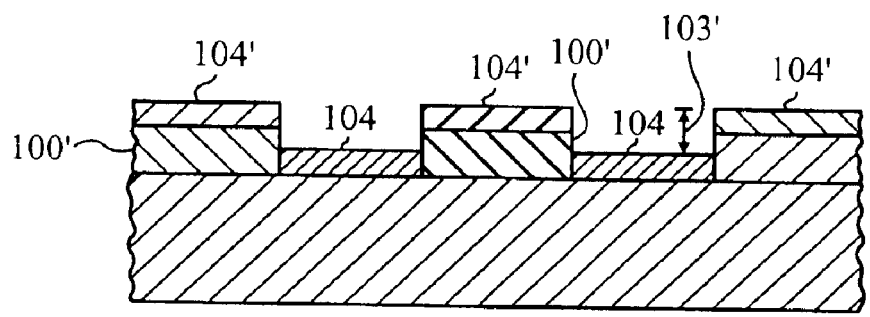

By applying an appropriate bias voltages across the ribbons 100 and the substrate 102, a portion of the ribbons 100 move towards and contact the substrate 102, as shown in FIG. 1b. The thickness $T_r$ of the ribbons 100 is designed to be $\lambda/4$ plus the thickness of the reflective layer 104 such that the distance 103' is also $\lambda/4$. When light having a wavelength $\lambda$ impinges on surfaces 104 and 104' with the ribbons 100 in the down position, as shown in FIG. 1b, the portion of light reflected from the surfaces 104' of the ribbons 100 will be out of phase with the portion of light reflected from the surfaces 104 of the substrate 102, thereby generating the conditions for destructive interference. By alternating the ribbons between the positions for constructive interference, as shown in FIG. 1a, and the positions for destructive interference, as shown in FIG. 1b, the grating light valve is capable of modulating the intensity of reflected light from an impinging light source having a wavelength $\lambda$.

Figure 2A:
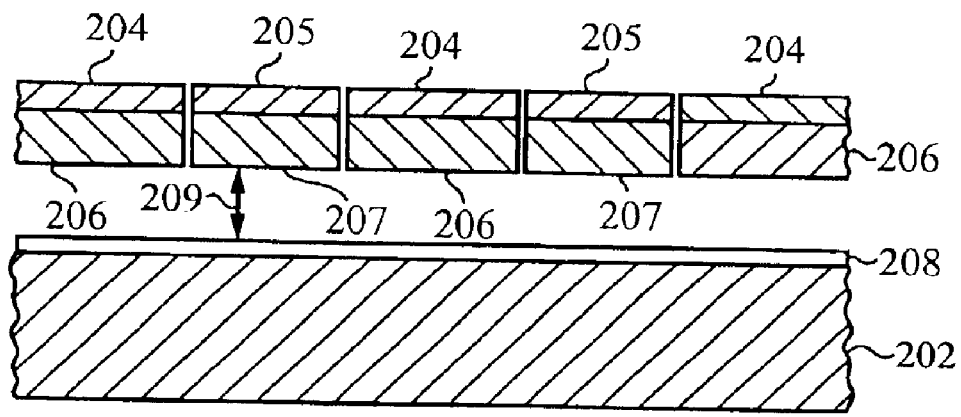
FIGS. 2a–b are cross-sectional representations of a microstructure comprising two sets of ribbon structures, in accordance with the embodiments.
Figure 2B:
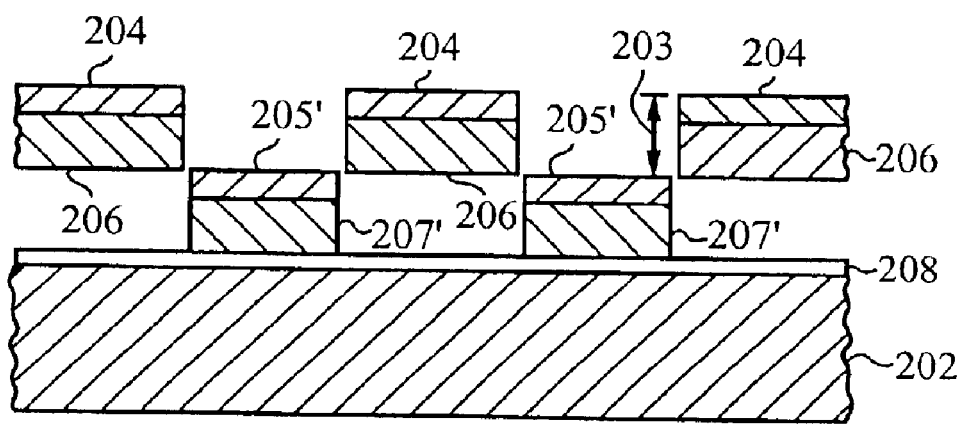

FIGS. 2a–b illustrate cross sectional views of an alternative optical MEM device construction. In accordance with this construction, the optical MEM device has a least two sets of alternating ribbons 206 and 207 that are approximately in the same reflective plane. Referring to FIG. 2a, the ribbons 206 and 207 are suspended over a substrate structure 202 by a distance 209. The ribbons 206 and 207 are provided with a reflective surfaces 204 and 205, respectively.

Preferably, the surface of the substrate 202, or a portion thereof, also has a reflective surface 208. The reflective surfaces of the substrate 208 and the reflective surfaces of the ribbons 204 and 205 are preferably configured to be separated by a distance approximately equal to a multiple of $\lambda/2$ of the impinging light source. Thus, the portion of light that is reflected from the compliment of surfaces 204, 205 and 208 are all phase, constructively interfere and the maximum intensity is observed. In operation, the flat diffraction grating light valve alternates between the conditions for constructive and destructive interference by moving the first set of ribbons 206 or the second set of ribbons 207 relative to each other by a distance corresponding to $\lambda/4$.

In one mode of operation, light is modulated by moving one set of alternating ribbons relative to a stationary set of alternating ribbons. The ribbons that are moved are referred to as the active ribbons and the stationary ribbons are referred to as the bias ribbons. The active ribbons are moved by any number of means including mechanical means, but are preferably moved by applying a sufficient bias voltage across the active ribbon and the substrate to generate Coulombic attractions between the active ribbons and the substrate.

Now referring to FIG. 2b, when a sufficient bias voltage is applied across the active of ribbons 207 and the substrate 202, the ribbons 207 are displaced relative to the bias ribbons 206 by a distance 203 that is approximately equal to a multiple of $\lambda/4$. Accordingly, the portions of light that are reflected from the surfaces 205' of the active ribbons 207 will destructively interfere with the portion of light that are reflected of the surfaces 204 of the bias ribbons 206. It will be clear to one skilled in the art that a grating light valve may be configured to modulate an incident light source with a wavelength $\lambda$ in other operative modes. For example, both sets of ribbons 206 and 207 may be configured to move and separate by multiples of $\lambda/4$ in order to alternate between the conditions for constrictive and destructive interference. In addition, ribbons may or may not contact the substrate during operation.

The ribbons of the MEM devices, described in FIGS. 1a–b and FIGS. 2a–b are preferably hermetically sealed within a die structure. Methods and materials used for providing a hermetically sealed die are described in the U.S. patent application Ser. No. 09/124,710, filed Jul. 29, 2001, entitled "METHOD OF AND APPARATUS FOR SEALING AN HERMETIC LID TO A SEMI CONDUCTOR DIE", now U.S. Pat. No. 6,303,986, the contents of which are hereby incorporated by reference.

Figure 3A:
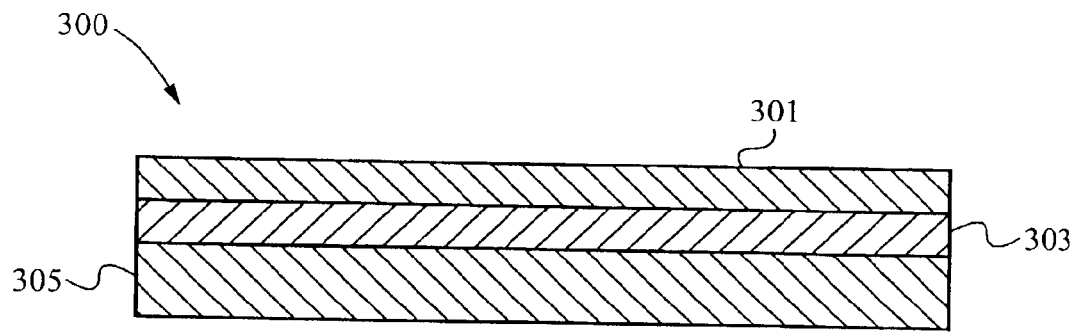
FIG. 3a is a cross-sectional representation of a ribbon structure, in accordance with the embodiments.

FIG. 3a shows a cross-sectional view of a portion of a micro-structure 300 formed in accordance with the embodiments. The micro-structure 300 has a silicon based under-layer or support layer 305 that is preferably silicon nitride-based with a thickness in a range of 700 to 1200 Angstroms. The micro-structure 300 also has a reflective top-layer 301 that is preferably formed from a metal and has thickness in a range of 250 to 1000 Angstroms. The reflective top-layer 301 can be formed from any number of metals and metal alloys, but is preferably formed from aluminum or other metal that can be deposited using sputtering techniques at relatively low temperatures.

Still referring to FIG. 3a, the micro-structure 300 can also have a silicon dioxide layer 303 with a thickness in a range of 800 to 1800 Angstroms. The silicon dioxide layer 303 is preferably interposed between reflective top-layer 301 and the under-layer 305. Alternatively, or in addition to the silicon dioxide layer 303, a silicon dioxide layer can be formed below the under-layer 305.

Figure 3B:
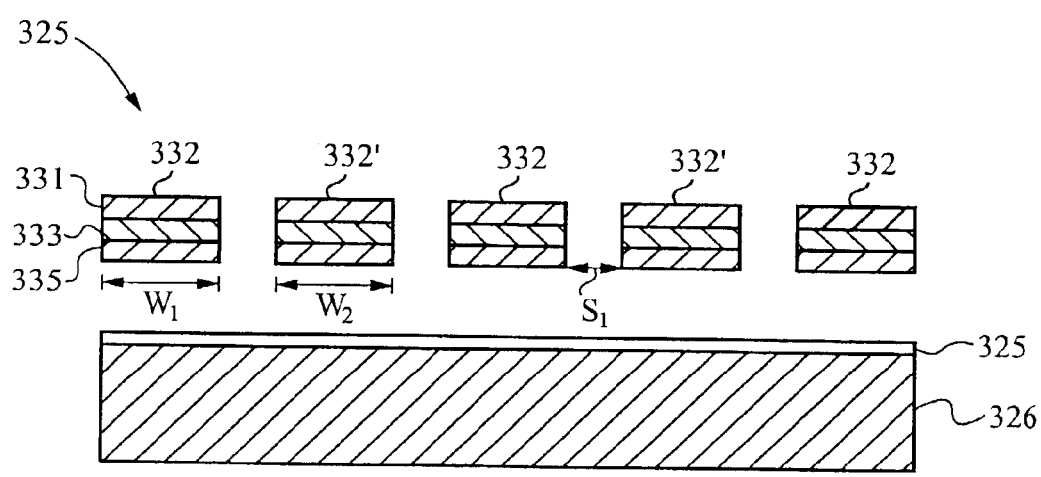

FIG. 3b shows a portion of a micro-device 325, in accordance with the embodiments. The micro-device 325 preferably has a plurality of ribbon structures 332 and 332' geometrically suspended over a substrate 326. Each of the ribbon structures 332 and 332' preferably has a multi-layer structure comprising an under-layer 335, a top-layer 331 and an compensating layer 333, such as those described above. The plurality of ribbons 332 and 332' can comprise an alternating first set of ribbons 332 and second set of ribbons 332' which are moved relative to each, such as explained above. In accordance with the embodiments of the invention, one set of the ribbons 332 or 332' moves while the other set of ribbons remains stationary. In alternative embodiments, both set of ribbons 332 and 332' move, although by different amounts, so that the relative phase of the light reflected from the ribbons 332 and 332' can be modulated from destructive through to constructive interference.

The substrate 326 can have a layer 325 of reflective material or any other suitable material to assist in the functionality of the micro-device 325. Also, while the ribbon structures 332 and 332', shown in FIG. 3b, all have uniform widths $W_1$ and $W_2$ and spacings $S_1$, any number of ribbons constructions and arrangements with varied widths $W_1$ and $W_2$ and varied spacings $S_1$ are contemplated. For example, ribbon structure arrangements having varying widths $W_1$ and $W_2$ and optimized spacings S are described in U.S. patent application Ser. No. 09/802,619, filed Mar. 8, 2001, entitled "HIGH CONTRAST GRATING LIGHT VALVE", the contents of which is hereby incorporated by reference. Also, while the preferred micro-structure(s) comprise a silicon nitride under-layer, reflective metal top-layer and silicon dioxide layer(s), it is understood that the composition the nitride under-layer, a reflective metal top-layer and a silicon dioxide layer(s) can be varied without departing from the spirit and scope of the embodiments. For example, the reflective metal top-layer may be formed from an alloy and the silicon nitride and silicon oxide layers can contain impurities and/or dopants such a boron, phosphorus and the like.

Figure 4:
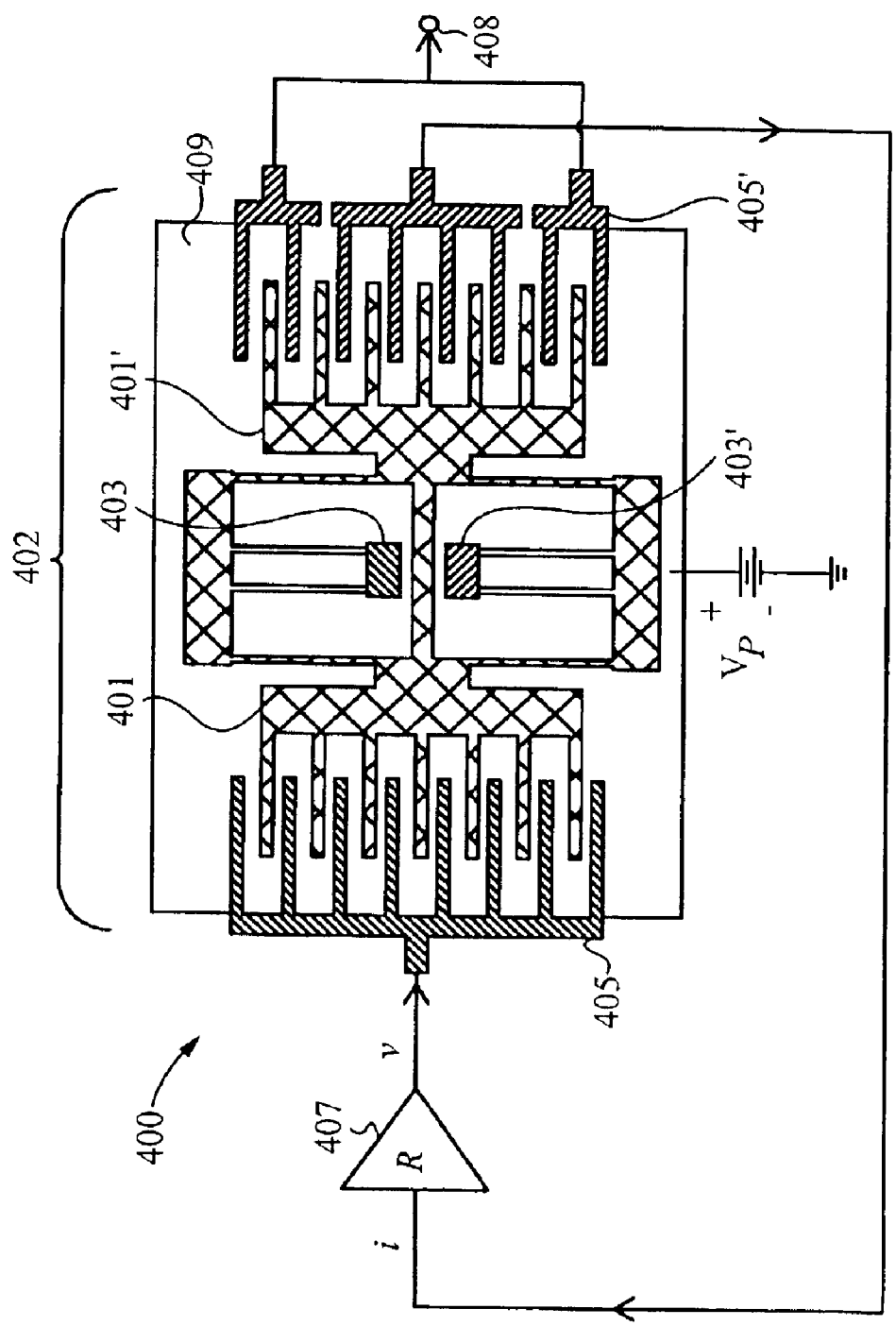
FIG. 4 is a schematic block-diagram of a MEMS oscillator.

Referring to FIG. 4, the embodiments can be included in MEMS. MEMS can have any number or simple or complex configurations, but they all operate on the basic principle of using the fundamental oscillation frequency of the structure to provide a timing signal to a coupled circuit. Referring to FIG. 4, a resonator structure 402 has a set of movable comb features 401 and 401' that vibrate between a set of matched transducer combs 405 and 405'. The resonator structure 402, like a pendulum, has a fundamental resonance frequency. The comb features 401 and 401' are secured to a ground plate 109 through anchor features 403 and 403'. In operation, a dc-bias is applied between the resonator 402 and a ground plate 409. An ac-excitation frequency is applied to the comb transducers 405 and 405' causing the movable comb features 401 and 401' to vibrate and generate a motional output current. The motional output current is amplified by the current to-voltage amplifier 407 and fed back to the resonator structure 402. This positive feed-back loop destabilizes the oscillator 400 and leads to sustained oscillations of the resonator structure 402. A second motional output current is generated to the connection 408, which is coupled to a circuit for receiving a timing signal generated by the oscillator 400. In accordance with the embodiments, anchor support features and post support features can be formed on the comb structures and or on the fingers of the comb structures to tune the MEMS oscillator to a preferred operating frequency.

Figure 5A:
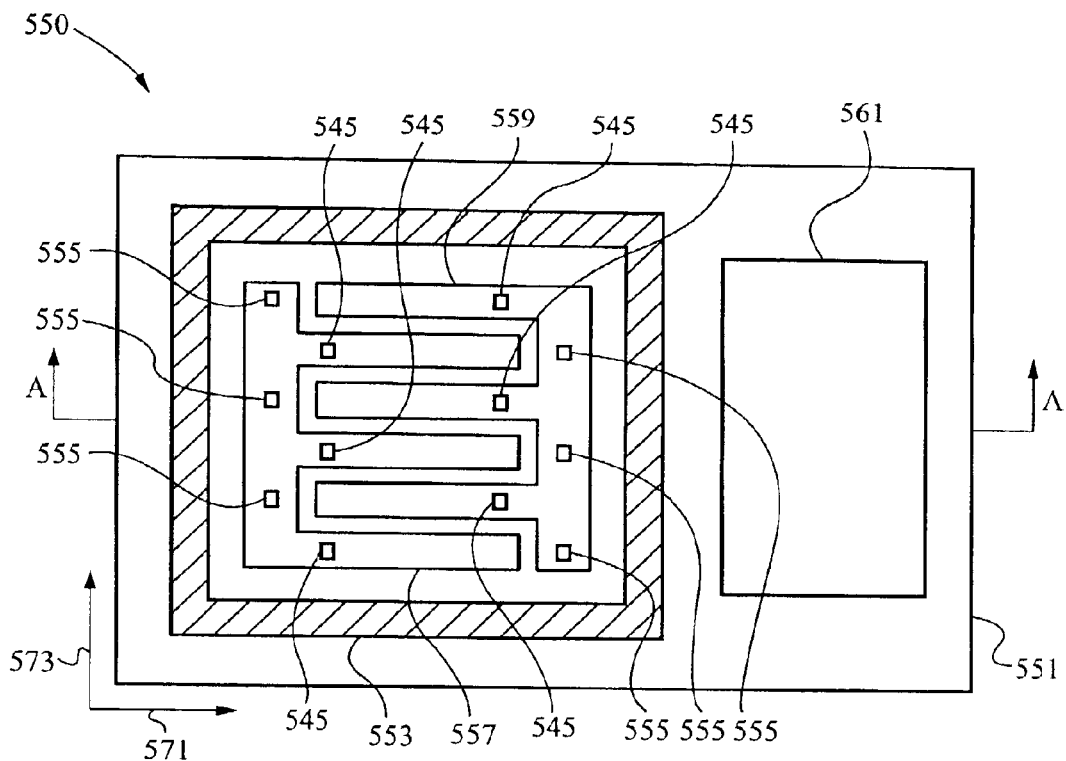
FIGS. 5a–b show a top view and a cross-sectional representation of a MEMS on a chip, in accordance with the embodiments.

FIG. 5a shows a top view of a micro-device 550 in the plane of the arrows 571 and 573. The micro-device 550 comprises a chip 551 with one or more comb structures 557 and 559. Each of the comb structures 557 and 559 has a plurality movable ribbon micro-structures. One or more of the comb structures 557 and 559 are preferably electrically coupled to a circuit 561, also on the chip 551 and configured for selectively moving the ribbons of one or more of the comb structures 557 and 559. Preferably, the comb structures 557 and 559 are coupled to and/or secured to the chip 551 through securing features 555 and 545. The securing features 555 and 545 preferably comprise a plurality of anchor and post support features, such as those described in detail below. The micro-device 550 also preferably has a sealing region around the comb structures 557 and 559 for sealing a optical lid, as described in detail above.

Figure 5B:
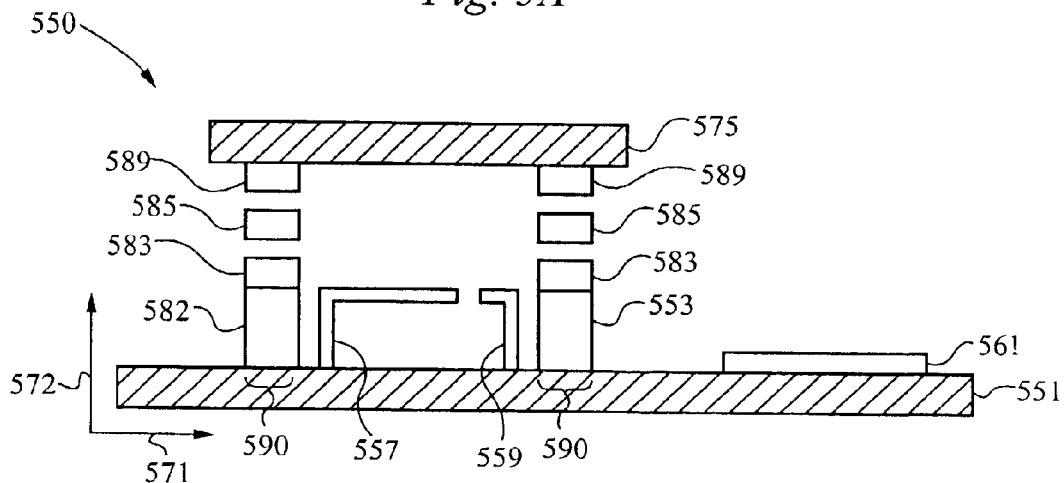

FIG. 5b illustrates a schematic side cross-sectional view of the micro-device 550 shown in FIG. 5a, in the plane of the arrows 571 and 572, which is orthogonal with the plane 571 and 573 through the line A—A of the FIG. 5a. From the side view shown in FIG. 5b, it can be seen that the comb structures 557 and 559 are suspended above the surface of the chip 551. The sealing region 590 can comprise a passivating layer 582, as shown, to hold lid 575 above the suspended comb structure 557 and 559. The lid 575 is preferably formed from glass, silicon, or other material or combination of materials suitable for the application at hand, viz. transparent to one or more wavelength of light to be modulated.

Figure 6A:
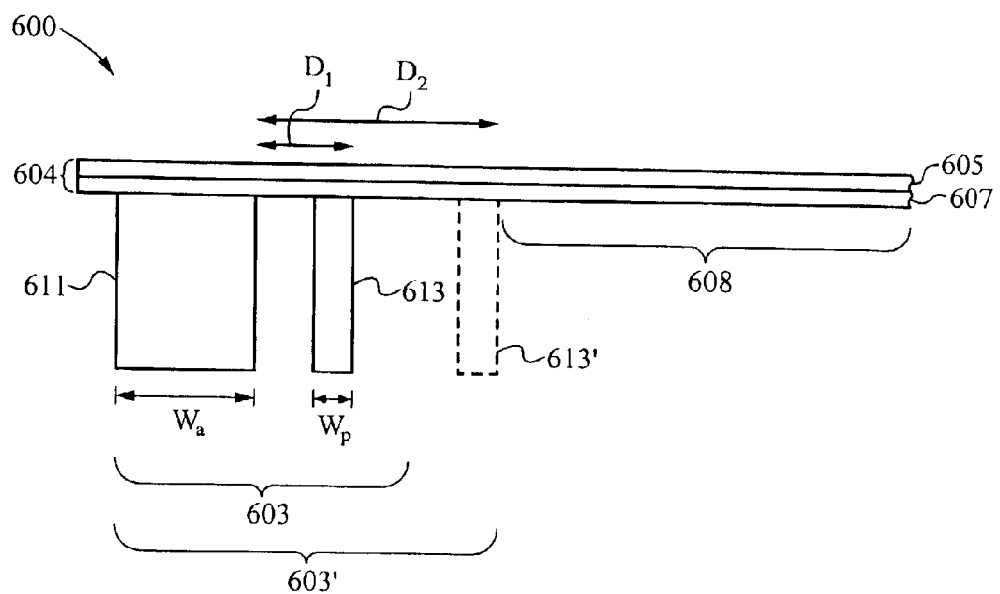
FIG. 6a shows a schematic side view of a ribbon structure with anchor features and a post support structure, wherein the separation between the anchor support feature and the post support feature is modified, in accordance with the method of the embodiments.

Referring now to FIG. 6a, a micro-structure configuration 600 comprises a cantilever or ribbon structure 604. The structure 604 preferably comprises a silicon nitride layer 607 and a reflective top-layer 605, as described in detail above. The structure 604 is coupled to a suitable substrate (not shown) through a support region 603. The structure 604 is preferably coupled to the substrate through one or more larger anchor support features 611 and one or more smaller post support features 613. The anchor support feature 611 and the post support feature 613 are separated by a first distance $D_1$, which can be selected during the fabrication of the microstructure configuration 600, such that the structure 607 exhibits a preferred set of physical and/or mechanical properties, as explained in detail below. In accordance with the embodiments, the larger anchor feature 611 preferably has average cross-sectional width $W_a$ in a range of 5.0 to 20 microns and the post support structure 613 preferably has an average cross-sectional width $W_p$ in a range of 0.5 to 5.0 microns. However, it is understood that actual dimensions of the anchor and post support features chosen will depend on the dimensions of the structure 604.

In accordance with the method of the embodiments, the physical or mechanical properties of the structure 604 can be tuned during the fabrication micro-structure configuration 600 by selecting the separation of the anchor support feature 611 and the post support feature 613 or by providing an additional post support feature 613' as shown by the dotted line, such that the anchor support features 611 and the second post support feature 613' are separated by a second distance $D_2$. Accordingly, the structure 604 is supported through a larger support region 603' and will generally require more energy to deflect or move the active portion 608 of the structure 604.

Figure 6B:
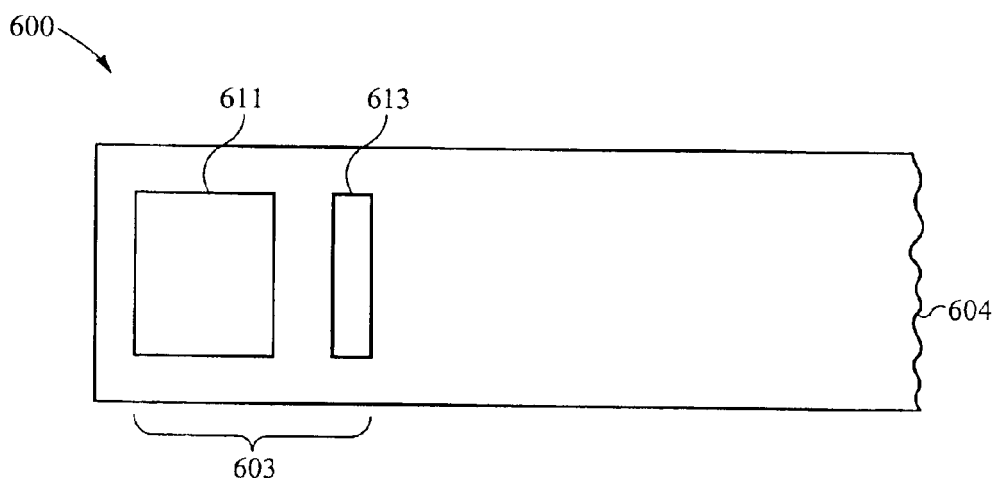
FIG. 6b, shows a top view of a portion of a ribbon structure comprising a support region with a single anchor support feature and single post support feature.
Figure 6C:
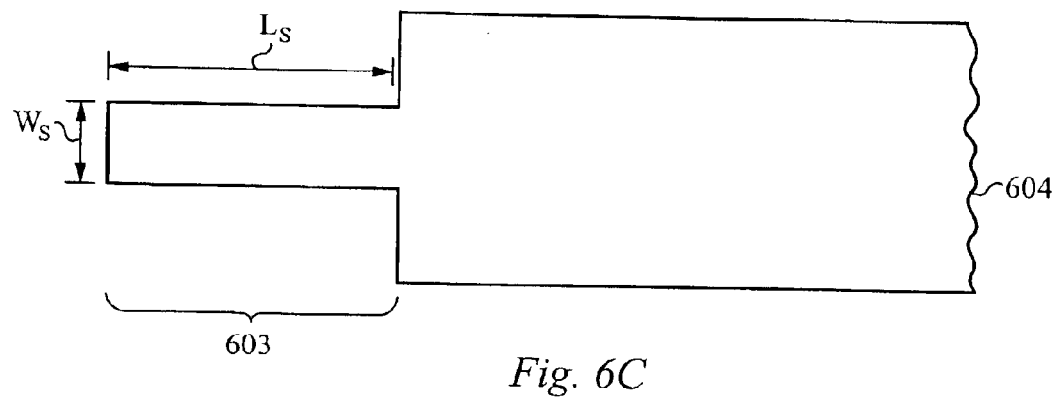
FIG. 6c, schematically illustrates the effective support area provided by the support region shown in FIG. 6b.

FIG. 6b shows a top view of the micro-structure 604 comprising a single anchor support features 611 and a single post support feature 613. The effective support surface area provided by a support region 603 comprising one anchor support feature 611 and one post support feature 613, illustrated schematically in FIG. 6c. Note that the effective support surface area is related to $W_s$ and $L_s$. For larger ribbon structures, which are supported from both ends and which are under high stress and/or tension, sufficient structural support may not be provided through support regions having only one anchor support feature and one post support feature.

Figure 7A:
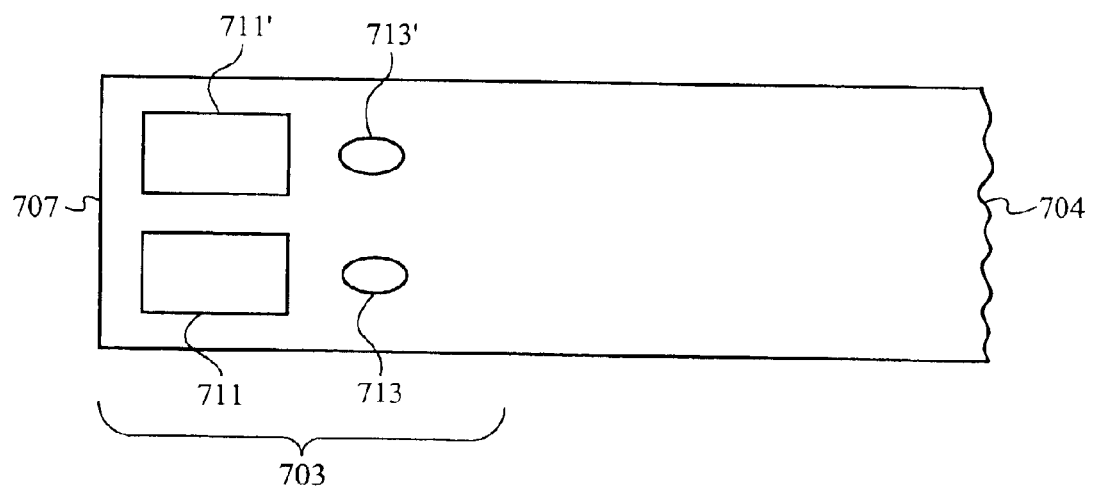
FIG. 7a shows a top view of a micro-structure supported over a substrate through a support region comprising a plurality of anchor support features and a plurality of post support features, in accordance with a preferred embodiment of the invention.
Figure 7B:
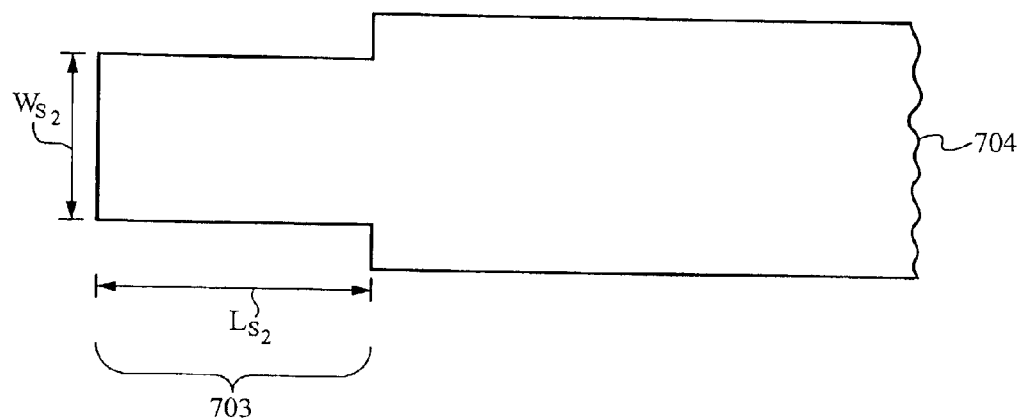

Now referring to FIG. 7a, a micro-structure 704 in accordance with the embodiments is preferably supported through one or more support regions 703 comprising a plurality of anchor support features 711 and 711' and a plurality of post support features 713 and 713'. By implementing multiple anchor support features and multiple post features within each of the support regions, the effective support area in each support region 703, related to $L_{S2}$ and $W_{S2}$, can be increased as illustrated schematically in FIG. 7b. Accordingly, support regions, such as 703, have the potential to support micro-structure exhibiting higher stress and/or tension.

Figure 7C:
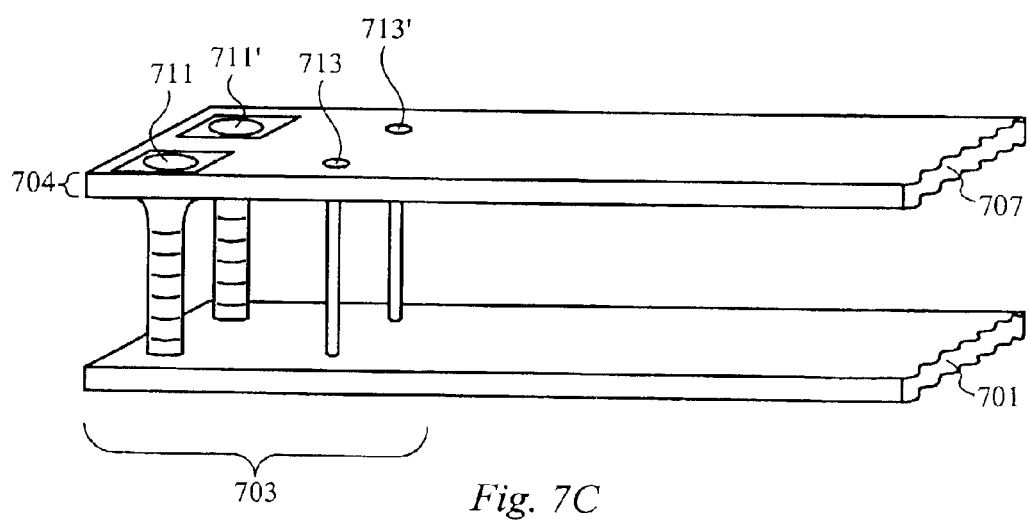
FIG. 7c, shows a prospective view of a micro-structure supported over a substrate through a support region comprising a plurality of anchor support feature and a plurality of post support features, in accordance with the embodiments.

FIG. 7c shows a portion of a suspended micro-structure 707, that is supported over a suitable substrate 701 through the support region 703 comprising a plurality of anchor support features 711 and 711' and a plurality of post support features 713 and 713', such as described above. The micro-structure 707 is preferably a ribbon structure that is also supported by a second support region also having a plurality of anchor support features and a plurality of post support features positioned at an opposing end of the 707.

Figure 8A:
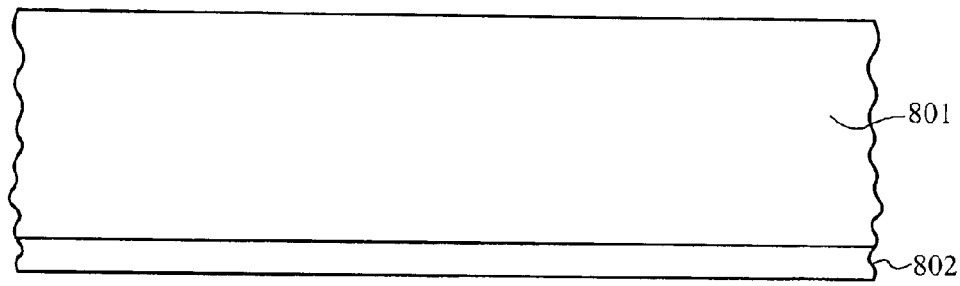
FIGS. 8a–e, show forming support features, in accordance with the method of the embodiments.
Figure 8B:
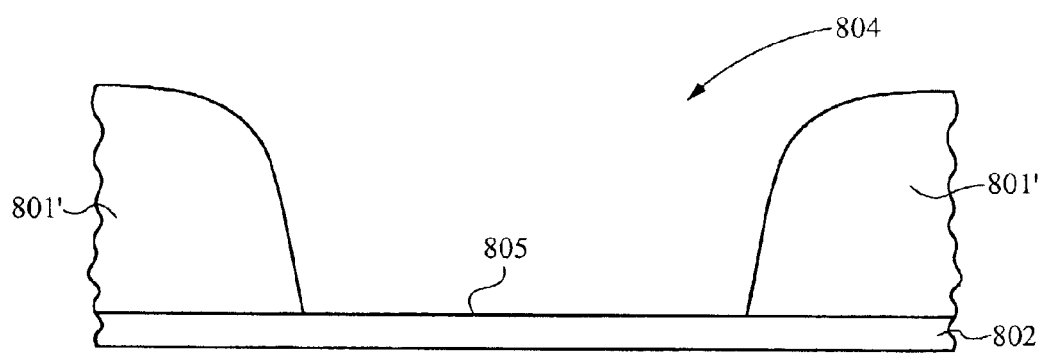
Figure 8C:
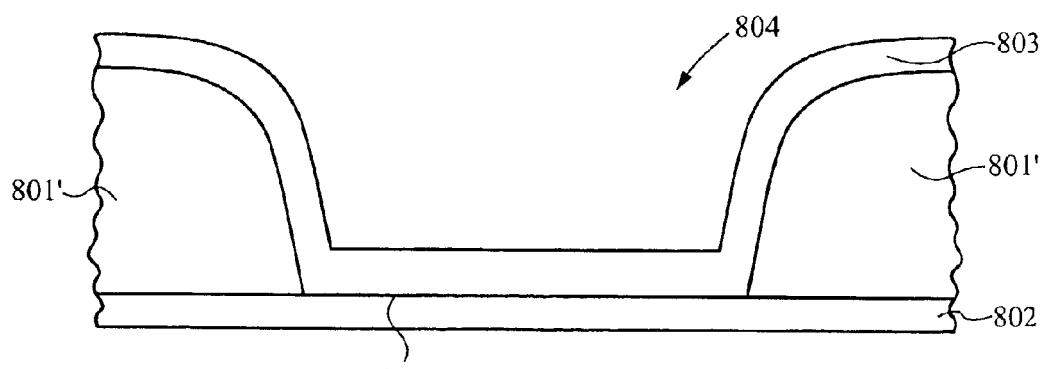

In accordance with the method the embodiments, anchor and posts support features are formed by similar processes. FIGS. 8a–e will be used to illustrate the formation of an anchor support feature or a post support feature. Referring to FIG. 8a, a layer 801 of sacrificial material, such as polysilicon, is deposited onto a suitable substrate structure 802, which preferably comprises an oxide layer, as explained in detail below. The sacrificial layer 801 is etched to form a patterned sacrificial layer 801' that is patterned with a support trench or a support dimple 804 as shown in FIG. 8b. The sacrificial layer 801 is preferably etched such that a portion of the substrate surface 805 is exposed and, thereby, is available for coupling with a device layer 803, as described in detail below.

After the support trench or dimple 804 is formed, then the device layer 803 is formed over the patterned sacrificial layer 801' such that a portion of the device layer 803 is formed over the exposed surface of the substrate 805 and through the support trench or dimple 804, thereby forming a support features. The device layer 803 preferably comprises silicon nitride and can also comprise one or more layers of silicon oxide and/or a reflective top layer, as described in detail below.

Figure 8D:
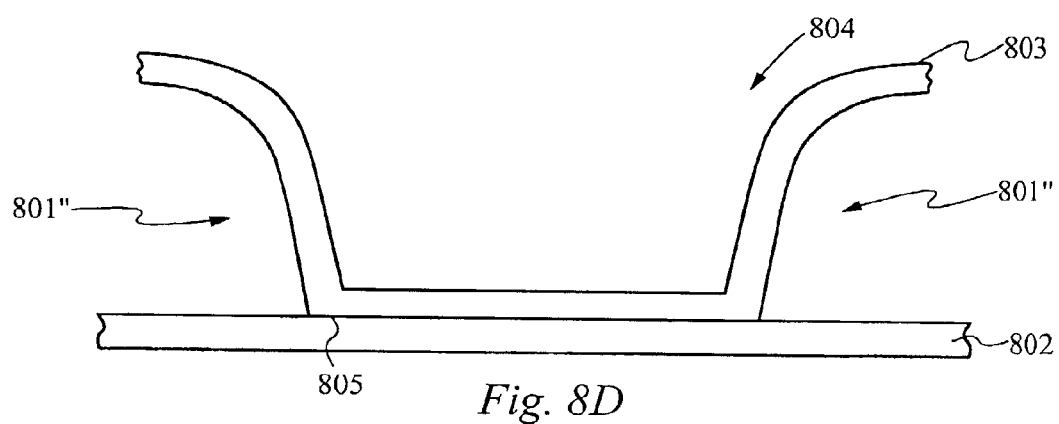
Figure 8E:
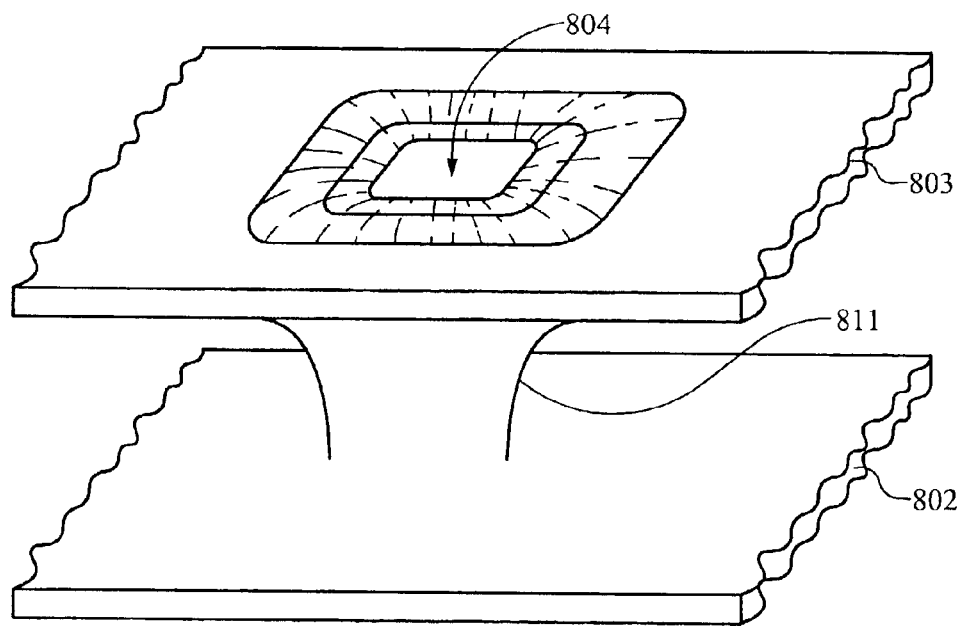

Now referring to FIG. 8d, after the device layer 803 is formed, then the patterned sacrificial layer 801' is etched, or partially etched, to form voids or gaps 801" and release the device layer 803, which remains coupled to the substrate 802 through the support feature formed in the support trench 804. Preferably, the patterned sacrificial layer 801' is etched using a dry etch process, such as described in the U.S. patent application Ser. No. 09/952,626, entitled MICROELECTRONIC MECHANICAL SYSTEM AND METHODS, filed Sep. 13, 2001, the contents of which is hereby incorporated by reference. In a preferred method of the invention the device layer 803 is cut or divided into ribbon structures prior to etching the patterned sacrificial layer 801', whereby each of the released ribbon structures remain coupled to the substrate 802 through support regions comprising a plurality of anchor support features and a plurality of post support features. FIG. 8e shows a perspective view of an anchor or a post feature 811 coupled to the substrate 802 and supporting the released device layer 803 formed in accordance with the method described above.

Figure 9:
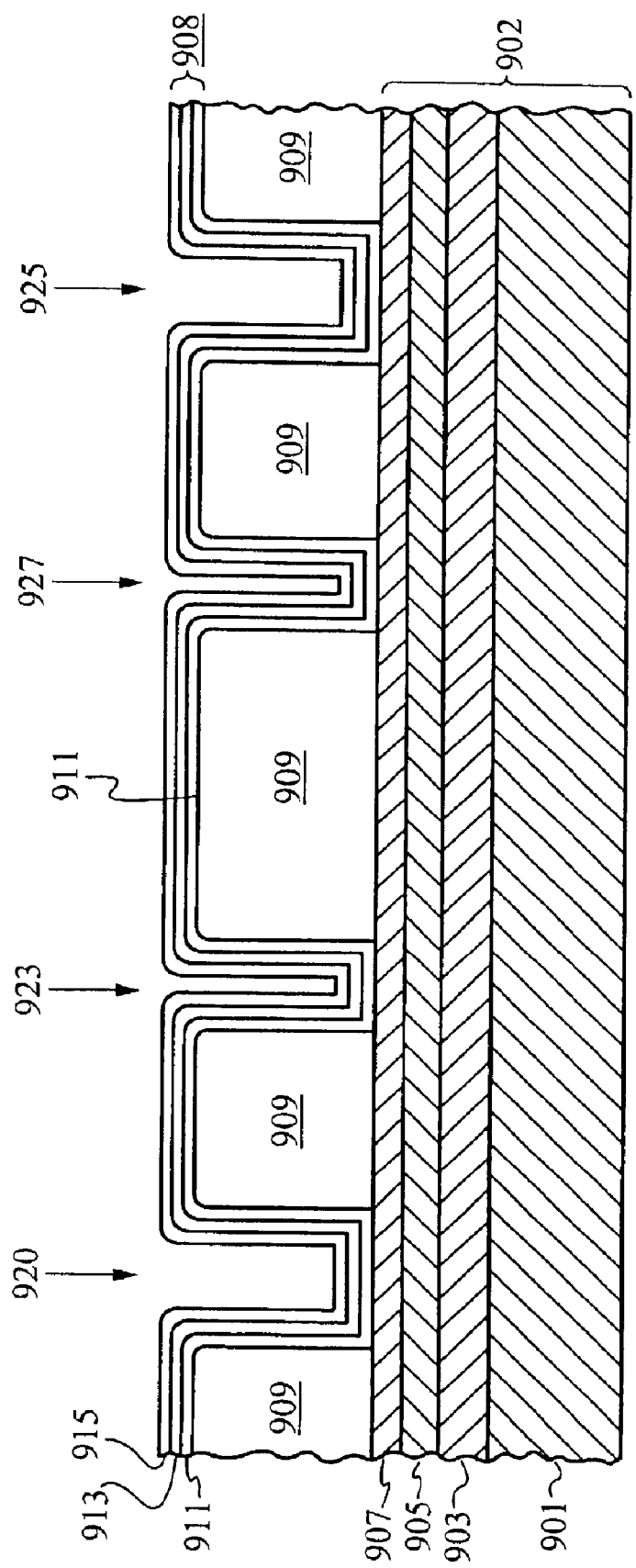
FIG. 9, shows a cross-sectional view of a micro-device with support regions for supporting a ribbon structure near both ends of the ribbon structure, in accordance with the embodiments.

FIG. 9 illustrates a cross-sectional representation of a micro-device comprising a multi-layer ribbon structure 908, in accordance with a preferred construction. The micro-device comprises a substrate 902, which can comprises a wafer layer 901, and silicon oxide layers 903 and 907, with a poly-silicon layer 905 therebetween. The thicknesses of the layers 901, 903, 905, and 907 are varied depending of the application at hand. However, it is preferable that the oxide layer 907 is present to couple to a ribbon structure 908, as previously described. The ribbon structure 908 preferably comprises a layer of silicon nitride 911, and a layer reflective top layer 915 of aluminum, as previously described. In some applications, a layer of silicon oxide 913, with a layer thickness in a range of 500 to 2000 Angstrom, can be provided to reduce strain between the silicon nitride layer 911 and the reflective top layer 915.

Still referring to FIG. 9, the ribbon structure 908 is preferably suspended over the substrate structure 902, such that there is one or more gaps 909 between the ribbon structure 908 and the substrate structure 902. Preferably, the ribbon structure 908 is supported to or couples to the substrate structure 902 through anchor support features 920 and 995 and post support features 923 and 927, as previously described, wherein a plurality of anchor support features and a plurality of post support features support each end of the ribbon structure 908.

Figure 10:
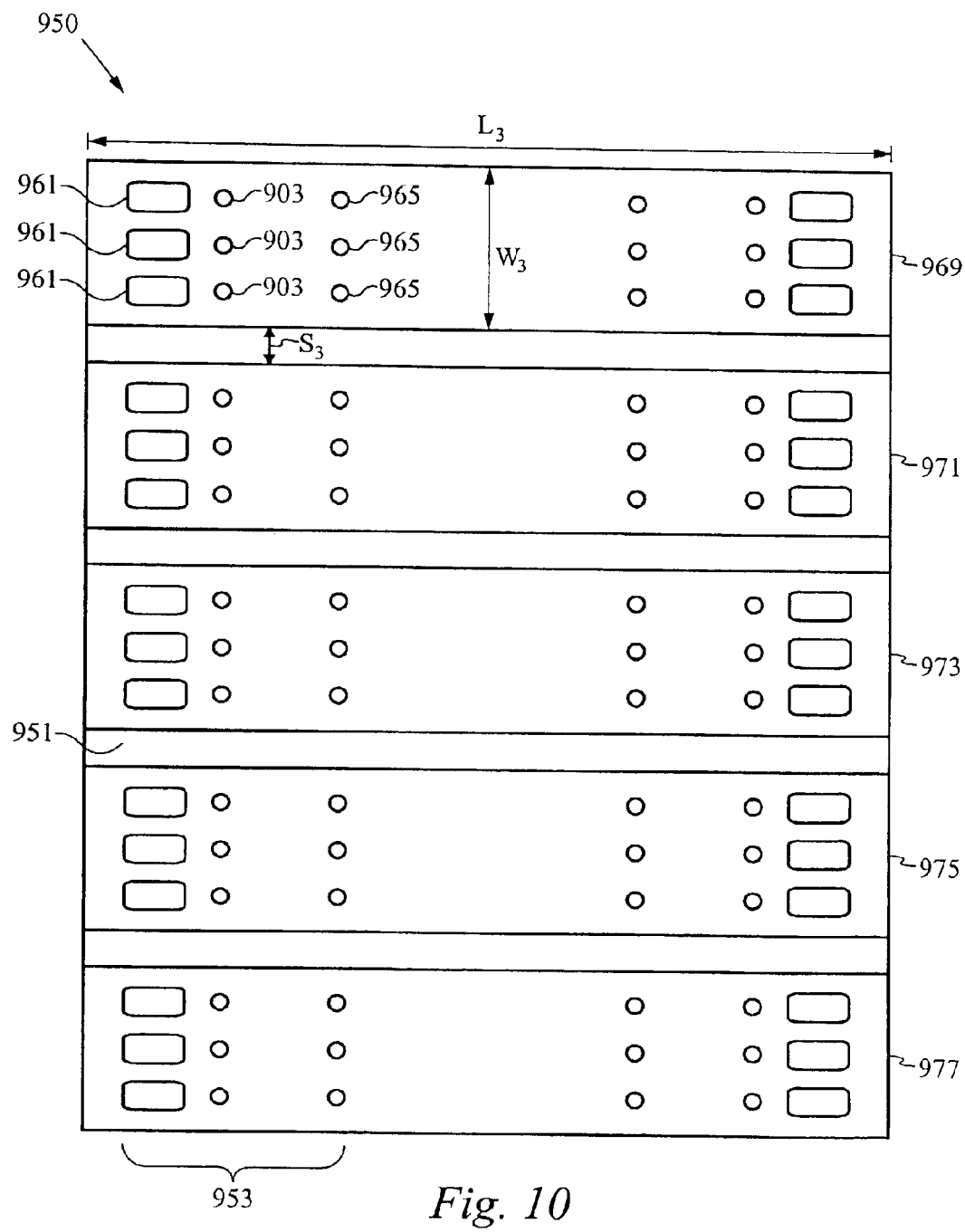
FIG. 10 shows a schematic top view of a plurality of ribbon structures arranged in parallel over a substrate each supported by a plurality of anchor support features and a plurality of post support features arranged in parallel rows, in accordance with the embodiments.

Referring now to FIG. 10, a MEM device 950 in accordance with the embodiments has a plurality of ribbon structures 969, 971, 973, 975 and 977 supported over a suitable substrate structure 951 through both ends of each of the ribbons 969, 971, 973, 975 and 977. The ribbons 969, 971, 973, 975 and 977 are arranged in parallel and separated by a distance $S_3$ in a range of 0.2 to 2.0 microns. The ribbon structures 969, 971, 973, 975 and 977 are preferably in a range of 50 to 500 microns long $L_3$ and in a range 4.0 to 40 microns wide $W_3$. A supporting region 953 preferably comprises a plurality of anchor support features 961 and a plurality of post support features 903 and 965, which are arranged in parallel rows along adjacent ends of each of the ribbon structures 969, 971, 973, 975 and 977. In accordance with an alternative embodiment, a MEM device can have sets of ribbons with anchor support features and post support features having varying or alternating separations, such a shown in FIG. 11.

Figure 11:
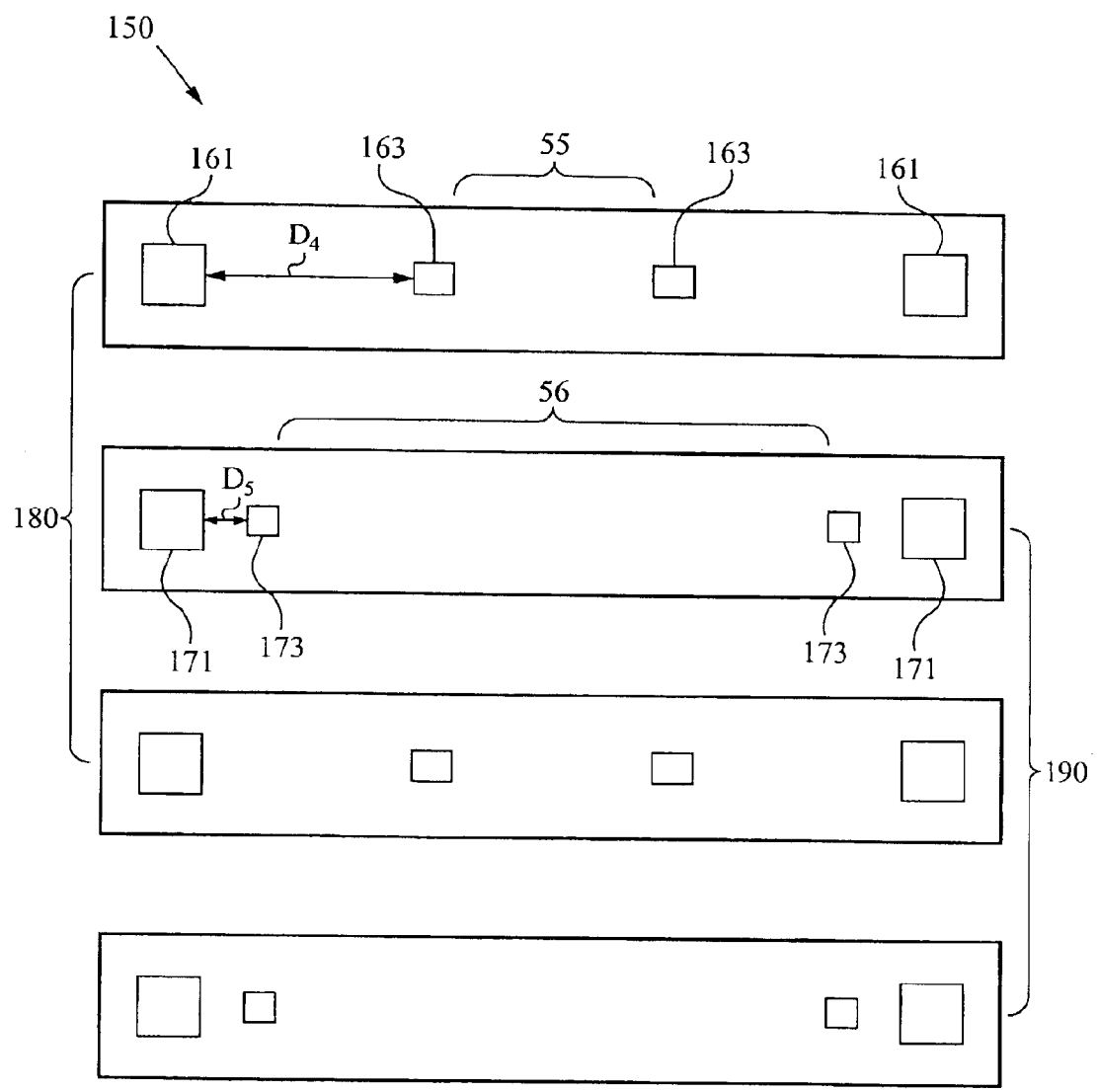
FIG. 11 shows a schematic top view of a plurality of ribbon structures supported through anchor support features and post support features in a staggered configuration, in accordance with an alternative embodiment of the embodiments.

Now referring to FIG. 11, in accordance an alternative embodiment, micro-device 150 has a first set of ribbon structures 180 with a first set of anchor support features 161 and post support features 163. The first set of anchor support features 161 and post support features 163 are separated by a distance $D_4$ to provide a first set of active regions 55. A second set of ribbon structures 190 have a second set of anchor support features 171 and post support features 173. The second set of anchor support features 171 and post support features 173 are separated by a different distance $D_5$ to provide the second set of active regions 56. The active regions 55 and 56 will have different mechanical and physical properties and, therefore, will operate at a different frequencies or will be actuated by different switching voltages. FIG. 11 is used for illustrative purposes only and any number of variations are considered to be within the scope of the embodiments. Also, while the first set of ribbon structures 180 and the second set of ribbon structures 190 are schematically illustrated as having a single anchor and post support feature at each end, it is understood that each ribbon within the set of ribbons 180 and 190 are preferably coupled through supporting regions comprising a plurality of anchor support features and a plurality of post support features, as described in detail above.

The present invention provides for a MEM device and/or an optical MEM device which can be tuned during fabrication by selecting the separations between anchor support structures and post support structures. Preferably, the MEM device of the embodiments has plurality of movable micro structures each supported through a plurality of anchor support features and a plurality of post support features. More preferably the MEM device of the embodiments has a plurality of ribbon structures each supported through opposing ends by a plurality of anchor support structures and a plurality of post support features.

The present invention has been described in terms of specific embodiments incorporating details to facilitate the understanding of the principles of construction and operation of the invention. While the preferred micro-device of the embodiments is an optical MEMS device, the invention in contemplated to be useful for making any number of micro-structure and microstructure devices including cantilever devices. As such, references, herein, to specific embodiments and details thereof are not intended to limit the scope of the claims appended hereto. It will be apparent to those skilled in the art that modifications can be made in the embodiment chosen for illustration without departing from the spirit and scope of the invention.

What is claimed is:

1. A micro-device comprising an elongated micro-structure coupled to a substrate by at least one end through a securing region comprising sets of securing features arranged laterally along the at least one end, wherein the sets of securing features comprise anchor features and post features.

2. The micro-device of claim 1, wherein the anchor features and the post features are arranged in parallel rows laterally along the at least one end.

3. A micro-device comprising an elongated micro-structure coupled to a substrate by at least one end through a securing region comprising sets of securing features arranged laterally along the at least one end, wherein the elongated micro-structure is a ribbon structure having a length in a range of 50 to 1000 microns and a width in a range of 4.0 to 40 microns.

4. A micro-device comprising an elongated micro-structure coupled to a substrate by at least one end through a securing region comorising sets of securing features arranged laterally along the at least one end, wherein the sets of securing features comprise silicon nitride.

5. The micro-device of claim 4, wherein the micro-structure comprises silicon nitride and is monolithic with the sets of securing features.

6. A micro-device comprising an elongated micro-structure coupled to a substrate by at least one end through a securing region comprising sets of securing features arranged laterally along the at least one end, wherein the micro-structure comprises a silicon nitride layer with a thickness in a range of 200 to 2000 Angstroms.

7. The micro-device of claim 6, wherein the micro-structure further comprises a reflective top-layer on at least a portion of the silicon nitride layer, the reflective layer having a thickness in a range of 250 to 1500 Angstroms.

* * * * *

UNITED STATES PATENT AND TRADEMARK OFFICE
CERTIFICATE OF CORRECTION

PATENT NO. : 6,908,201 B2
DATED : June 21, 2005
INVENTOR(S) : Gudeman et al.

It is certified that error appears in the above-identified patent and that said Letters Patent is hereby corrected as shown below:

Column 10,
Line 50, after "a securing region", replace "comorising" with -- comprising --.

Signed and Sealed this

Twenty-third Day of August, 2005

JON W. DUDAS
*Director of the United States Patent and Trademark Office*